(12) United States Patent
Koizumi

(10) Patent No.: US 10,818,527 B2
(45) Date of Patent: Oct. 27, 2020

(54) SUBSTRATE HOLDING MEMBER, SUBSTRATE PROCESSING DEVICE, METHOD FOR CONTROLLING SUBSTRATE PROCESSING DEVICE, AND STORAGE MEDIUM STORING PROGRAMS

(71) Applicant: EBARA CORPORATION, Tokyo (JP)

(72) Inventor: Ryuya Koizumi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/266,813

(22) Filed: Feb. 4, 2019

(65) Prior Publication Data

US 2019/0252213 A1  Aug. 15, 2019

(30) Foreign Application Priority Data

Feb. 13, 2018  (JP) ................. 2018-023302

(51) Int. Cl.
| | |
|---|---|
| H01L 21/67 | (2006.01) |
| H01L 21/673 | (2006.01) |
| H01L 21/66 | (2006.01) |
| G01N 21/95 | (2006.01) |
| C25D 17/06 | (2006.01) |
| C25D 17/00 | (2006.01) |
| H01L 21/677 | (2006.01) |

(52) U.S. Cl.
CPC .......... *H01L 21/673* (2013.01); *C25D 17/001* (2013.01); *C25D 17/06* (2013.01); *G01N 21/9505* (2013.01); *H01L 21/6723* (2013.01); *H01L 21/67028* (2013.01); *H01L 21/67057* (2013.01); *H01L 21/67173* (2013.01); *H01L 21/67288* (2013.01); *H01L 21/67751* (2013.01); *H01L 22/12* (2013.01); *H01L 2224/11462* (2013.01)

(58) Field of Classification Search
CPC ............ H01L 21/673; H01L 21/67028; H01L 21/67057; H01L 21/67173; H01L 21/6723; H01L 21/67288
USPC .......................................................... 438/16
See application file for complete search history.

(56) References Cited

U.S. PATENT DOCUMENTS

| 2005/0014368 A1 | 1/2005 | Yoshioka et al. |
| 2012/0052654 A1* | 3/2012 | Yang .................. H01L 21/6836 |
| | | 438/458 |

FOREIGN PATENT DOCUMENTS

JP  4124327 B2  7/2008

* cited by examiner

*Primary Examiner* — Elias Ullah
(74) *Attorney, Agent, or Firm* — Rothwell, Figg, Ernst & Manbeck, P.C.

(57) ABSTRACT

The present invention provides a substrate holding member comprising: a first holding member; a second holding member that cooperates with the first holding member to hold the substrate therebetween; and a transparent portion provided in at least one of the first and second holding members.

22 Claims, 10 Drawing Sheets

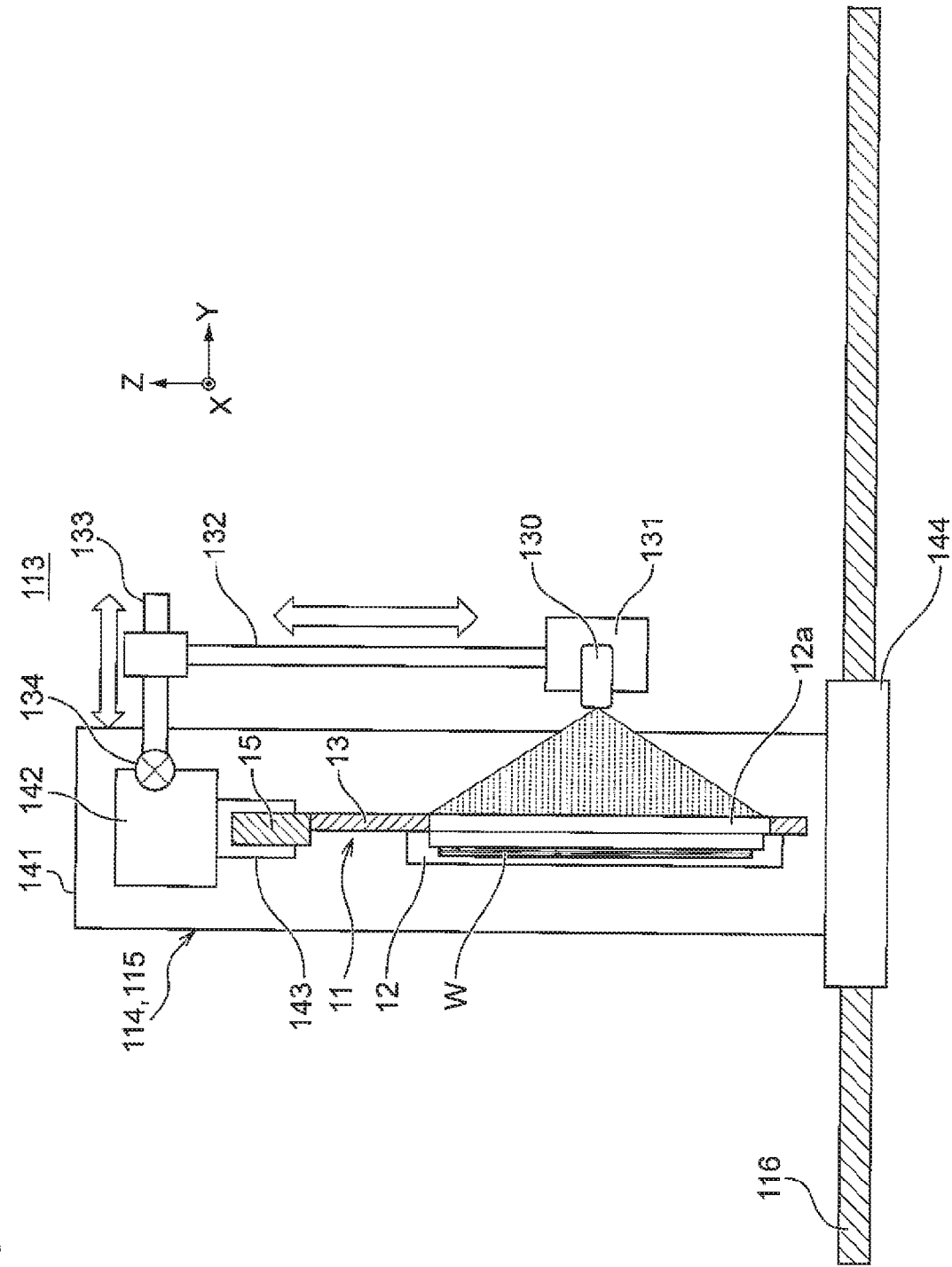

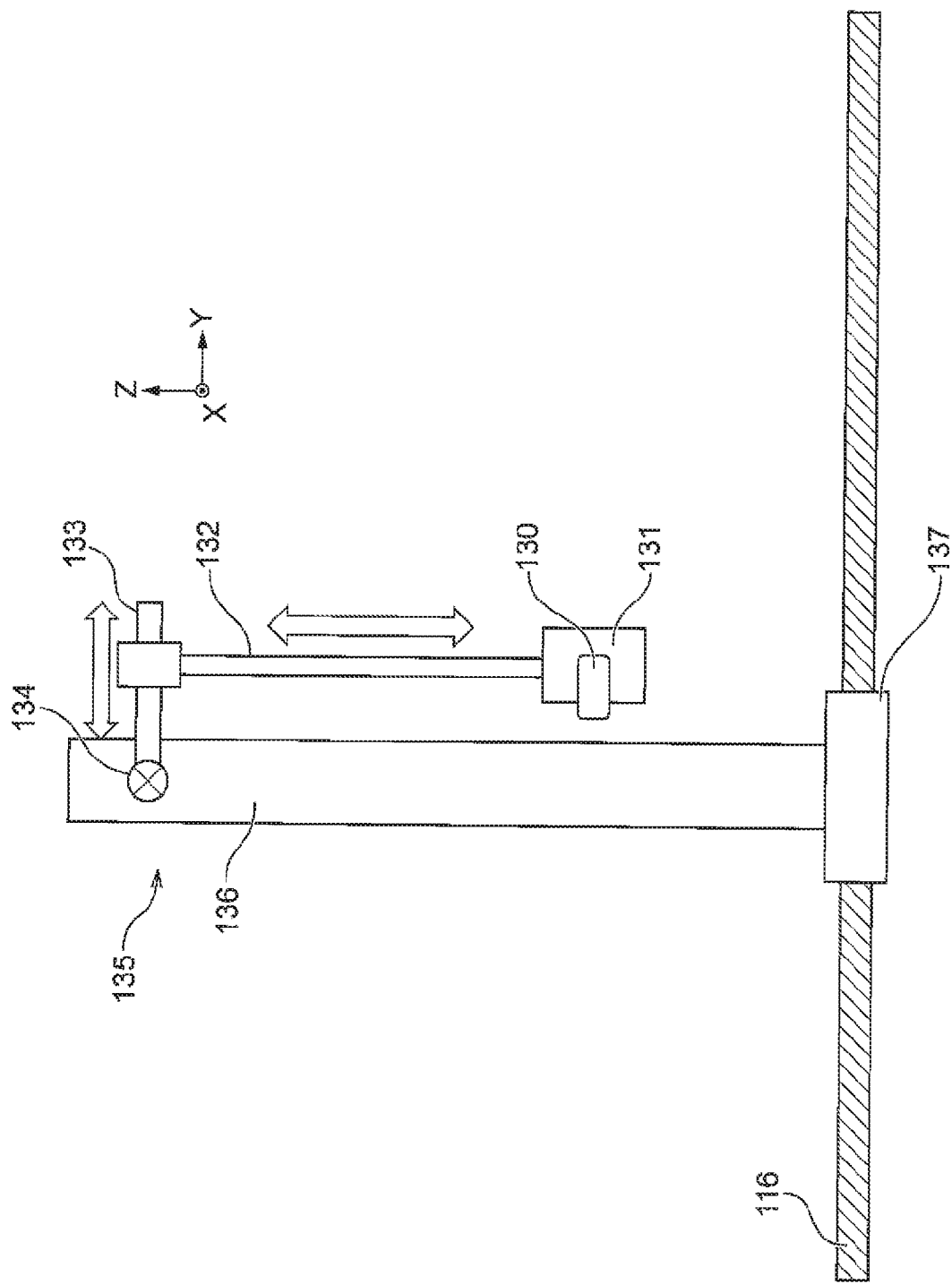

SUBSTRATE HOLDING MEMBER, SUBSTRATE PROCESSING DEVICE, METHOD FOR CONTROLLING SUBSTRATE PROCESSING DEVICE, AND STORAGE MEDIUM STORING PROGRAMS

CROSS REFERENCE TO RELATED APPLICATION

This application claims priority to Japanese Application Number 2018-023302, filed Feb. 13, 2018, the entire content of which is hereby incorporated by reference.

TECHNICAL FIELD

The present invention relates to a substrate holding member, a substrate processing device, a method for controlling a substrate processing device, and a storage medium storing programs for computers to carry out a method for controlling a substrate processing device.

RELATED ART

There exist plating devices to plate substrates mounted on substrate holders (e.g., Patent Literature 1). Substrate holders for one-side plating now in common use expose a substrate surface through an opening in the substrate holder to plate the front face of the substrate while holding the back face of the substrate in a sealed space within the substrate holder. This type of substrate holder for one-side plating may cause leakage of processing solution (liquid chemical) into the substrate holder if the seal is defective or deteriorating with age. There may be a crack or a fracture on the back of the substrate before it is introduced to the plating device, or a crack or a fracture may occur on the back of the substrate when it is within the plating device. Plating devices now in common use, which do not have a means for detecting when a crack or a fracture occurs on the back of the substrate or when processing solution leaks into the substrate holder, have the following problem.

It takes a lot of time to investigate the cause of the substrate crack or processing solution leak, making it difficult to identify and eliminate the cause. If such substrate cracks or fractures are left unrepaired, fragments may enter a plating tank, which may, in turn, adversely affect a pump or other instruments in a plating-solution circulating system, and plating process quality. In the case of multilayer plating, if a processing-solution leak is left unrepaired, plating solution and other processing solutions from an upstream tank may leak out of the substrate holder, enter a subsequent plating tank, and contaminate the plating solution in that tank. Further, the contacts of substrates (wafer contacts) and the contact of the substrate holding member may be corroded by the processing solution.

PRIOR ART LITERATURE

Patent Literature

Patent Literature 1: Japanese Patent No. 4124327

SUMMARY OF THE INVENTION

The object of the present invention is to solve the above-described problem, at least to some extent.

Means for Solving the Problem

In one aspect, the present invention provides a substrate holding member comprising a first holding member, a second holding member used to hold a substrate between the first and second holding members, and a transparent portion provided in at least either one of the first and second holding members.

In another aspect, the present invention provides a substrate processing device comprising: a substrate holding member including at least in part a transparent portion or made at least in part of a transparent portion; and an imaging device for imaging the interior of the substrate holding member through the transparent portion of the substrate holding member.

In still another aspect, the present invention provides a method for controlling a substrate processing device, comprising: holding a substrate in a substrate holding member including at least in part a transparent portion or made at least in part of a transparent portion; imaging the interior of the substrate holding member through the transparent portion of the substrate holding member; determining the presence or absence of any defects in the substrate and/or the substrate holder on the basis of image data taken. In still another aspect, the present invention provides a storage medium storing a program for a computer to carry out the above-described method.

BRIEF DESCRIPTION OF THE DRAWINGS

FIG. 4A shows an example of a substrate-holder-interior monitor at a transport device.

FIG. 4B shows another example of the substrate-holder-interior monitor at the transport device.

DESCRIPTION OF EMBODIMENTS

Some embodiments of the present invention are described below with reference to the accompanying drawings. In the following embodiments, identical or corresponding members are denoted by the same reference symbols, and redundant description thereof are omitted. For convenience, the words "top," "bottom," "left," "right," etc., are used to indicate positions or directions as viewed in the accompanying drawings, which may be different from those of the arrangement of the device when actually in use, etc. When one member and another member are described as "positioned on opposite sides of a substrate, it means that one member is positioned to face one side of the substrate and the other member is positioned to face the opposite side of the substrate. The substrate may be provided with wiring on only one or both sides thereof.

First Embodiment

Figure 1:
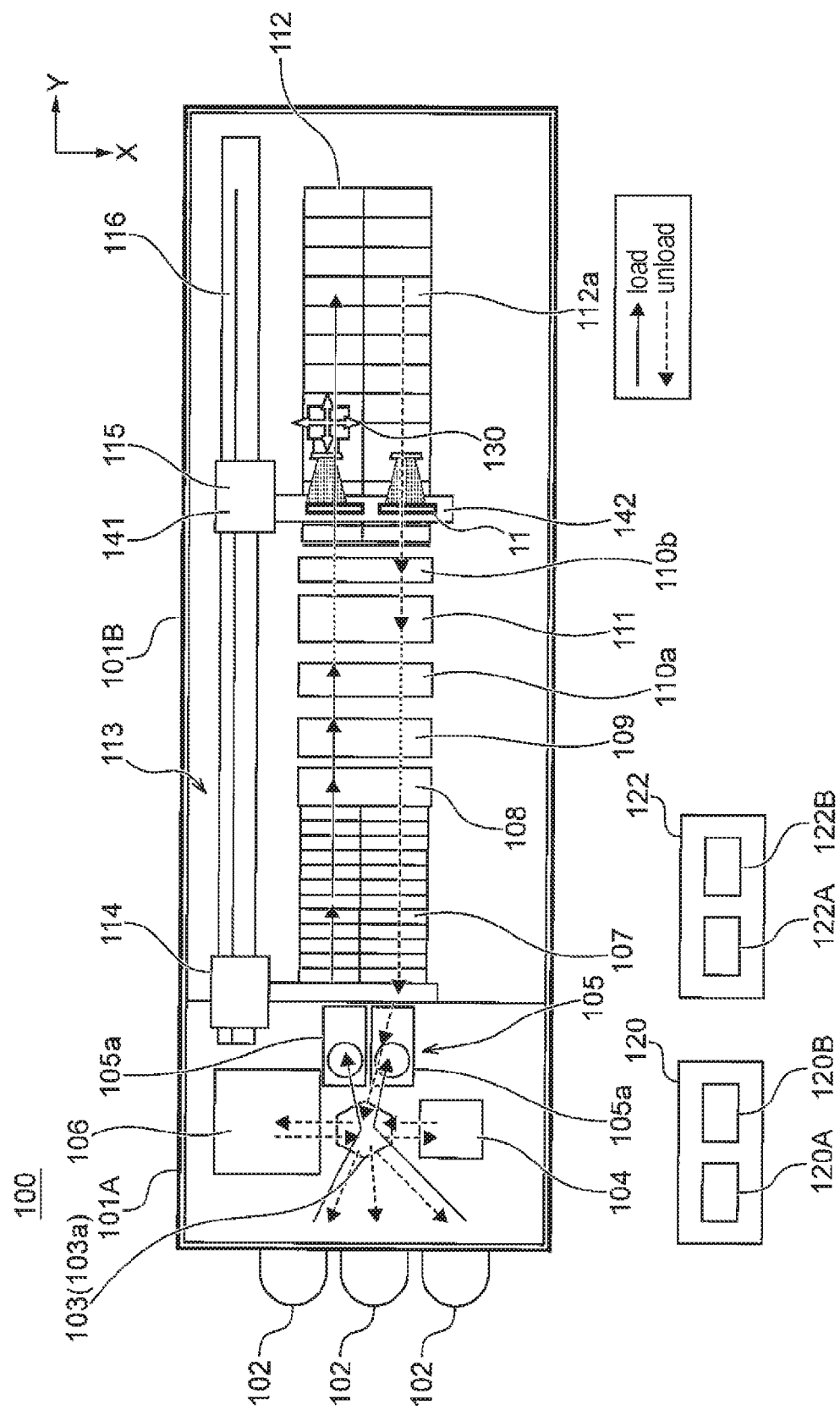
FIG. 1 shows the entire arrangement of a substrate processing device according to one embodiment of the present invention.

FIG. 1 shows the overall arrangement of the substrate processing device according to the first embodiment of the present invention. In this embodiment, the substrate processing device 100 is an electrolytic plating device. This electrolytic plating device, described below, is one example, and the present invention is applicable to substrate processing devices comprising any other plating devices.

The substrate processing device 100 is mainly divided into: a loading/unloading section 101A where a workpiece, a substrate W, is loaded into and unloaded from a substrate holder 11 (see FIGS. 3A, 3B); and a processing section 101B where the substrate W is processed. The substrate W may be of circular, polygonal, or any other shape. The substrate W may be a semiconductor wafer, a glass substrate, a liquid crystal substrate, a printed circuit substrate, or any other workpiece.

The loading/unloading section 101A comprises a plurality of cassette tables 102, an aligner 104, a substrate loading/unloading subsection 105, and a spin dryer 106. The cassette tables 102 are equipped with cassettes containing substrates W. The aligner 104 aligns the position of an orientation flat, a notch, or the like in the substrate W to a set direction. The substrate loading/unloading subsection 105 comprises one or more substrate loading/unloading devices 105a configured to mount and dismount the substrate W into and from the substrate holder 11. The spin dryer 106 dries out the wafer W, after being plated, by spinning it at high speed. At the center of these units is disposed a substrate transport device 103 comprising a transport robot 103a for moving the substrate W between the units.

The processing section 101B comprises: a stocker 107 where the substrate holder 11 is stored and temporarily placed; a pre-wet tank 108; a pre-soak tank 109; a pre-rinse tank 110a; a blow tank 111; a rinse tank 110b; and a plating subsection 112. In the pre-wet tank 108, the wafer W is soaked in pure water. In the pre-soak tank 109, oxide film on an electrically conductive layer, such as a seed layer, formed on the wafer W is etched away. In the pre-rinse tank 110a, the substrate W after presoaked is cleaned together with the substrate holder 11, using a cleaning liquid (pure water). In the blow tank 111, the liquid on the substrate so cleaned is dried off. In the rinse tank 110b, the wafer W, after plated, is cleaned together with the substrate holder 11, using a cleaning liquid. The plating subsection 112 has a plurality of plating tanks 112a equipped with an overflow tank. Each plating tank 112a receives one wafer W therein and plates it with copper plating or the like by soaking it in a plating solution held therein. The type of plating solution is not particularly limited and may be any plating solution that suits the purpose. The configuration or arrangement of the processing section 101B of the substrate processing device 100 described here is one example and may be modified in any suitable manner.

The substrate processing device 100 comprises a substrate-holder transport device 113 of any suitable drive type (e.g., liner motor type) disposed on the lateral side of the above-described units or members to transport or move the substrate holder 11 to and away from the units or members. The substrate-holder transport device 113 comprises a first transporter 114 and a second transporter 115. The first and second transporters 114 and 115 run on a rail 116. The first transporter 114 moves the substrate holder 11 between the substrate loading/unloading subsection 105 and the stocker 107. The second transporter 115 moves the substrate holder 11 between the stocker 107, pre-wet tank 108, pre-soak tank 109, pre-rinse tank 110a, blow tank 111, rinse tank 110b, and plating tank 112a. The transport between the units may be made by the first transporter 114 instead, dispensing with the second transporter 115.

The plating system including the substrate processing device 100 so formed comprises a device computer 120 adapted to control the above-describe units, and an image diagnosis terminal 122. The device computer 120 comprises: memory 120B storing various setting data and programs; and a CPU 120A for executing the programs in the memory 120B. The memory 120B has a storage medium which may be any suitable volatile storage medium and/or non-volatile storage medium. There may be one or more such storage media, such as ROMs, RAMs, hard disks, CD-ROMs, DVD-ROMs, and flexible disks. The programs stored in the memory 120B include, for example, a program for controlling the transfer of the substrate transport device 103, a program for monitoring control of the interior of the substrate holder (which will be described later), a program for controlling the mounting and dismounting of substrates into and away from the substrate holder at the substrate loading/unloading subsection 105, a program for controlling the transfer of the substrate-holder transport device 113, and a program for controlling the plating at the plating subsection 112. The device controller 120 is configured for wired or wireless communication with an unillustrated master controller for comprehensively controlling the substrate processing device 100 and other related devices, and exchanges data with a database of the master controller.

The image diagnosis terminal 122 comprises memory 122B storing programs and a CPU 122A for executing the programs in the memory 122B. The memory 122B has a storage medium which may be any suitable volatile storage medium and/or non-volatile storage medium. There may be one or more such storage media, such as ROMs, RAMs, hard disks, CD-ROMs, DVD-ROMs, and flexible disks. The device computer 120 and/or image diagnosis terminal 122 is configured for wired or wireless communication with an external server and may share with the server at least part of image processing and machine learning in the monitoring control of the interior of the substrate holder (described later).

Figure 2A:
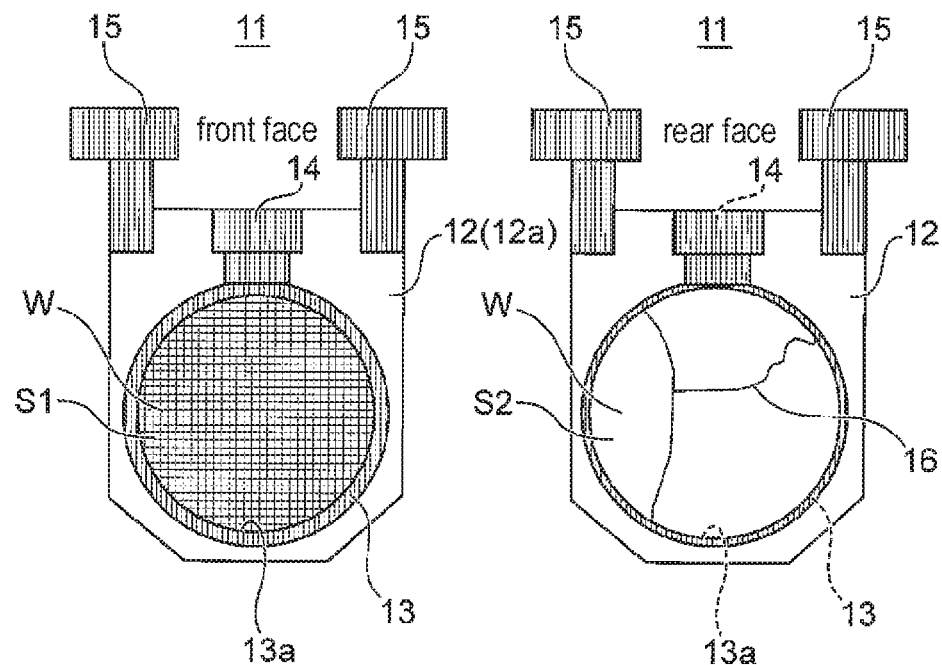
FIG. 2A shows an example of a substrate holder.
Figure 5A:
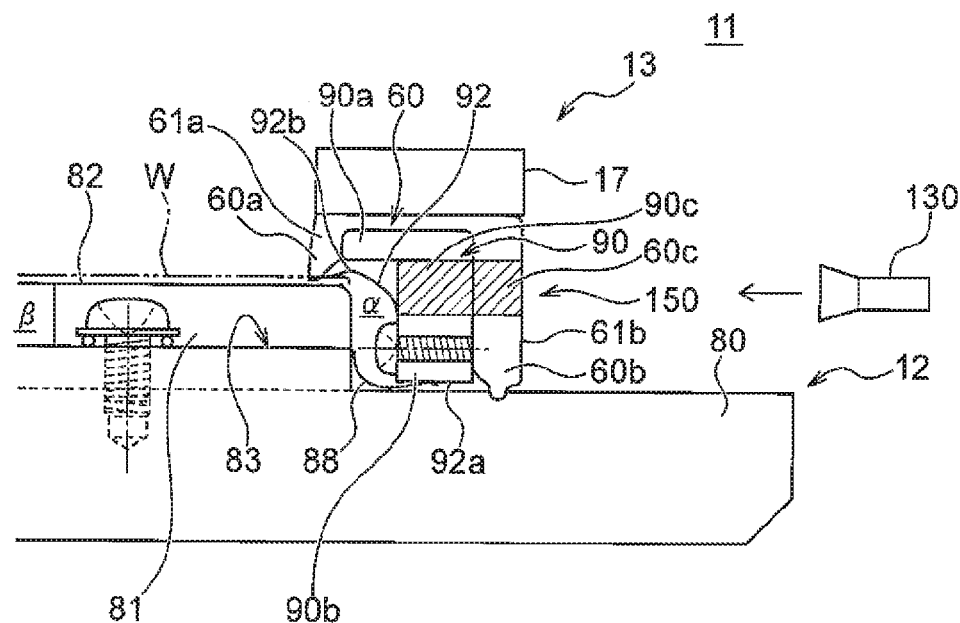
FIG. 5A shows another example of the substrate holder.

FIG. 2A shows an example of the substrate holder. The substrate W described here is a circular wafer, but this is only one example. The substrate W may instead be of polygonal or any other suitable shape for the present invention. The substrate holder 11 comprises: a first holding member 12 and a second holding member 13 which hold the substrate W therebetween; and hangers 15 for supporting the substrate holder 11. The first holding member 12 is adapted to support the substrate W and is of generally rectangular shape in plan view larger in size than the substrate W. The substrate W has a front face S1 and a back face S2, the front face S1 being plated and the back face S2 being supported by the first holding member 12. In this example, the first holding member 12 is entirely made of a transparent material. In other words, the first holding member 12 is entirely formed of a transparent portion 12a. In the case where, as shown in FIGS. 5A, B, the first holding member 12 comprises a base 80 and a ridge (support base) 81, only the base 80 may be entirely made of a transparent material, or both the base 80 and the ridge 81 may be entirely made of a transparent material. The degree of transparency is such that the interior of the substrate holder 11, or the back face S2 of the substrate W, is observable through the first holding member 12. The transparent material may be, for example, a transparent resin (PET, PVC, acrylic, polycarbonate, or the like), a reinforced glass, or the like. The second holding member 13 is an annular member that cooperates with the first holding member 12 to hold the outer edge of the substrate W therebetween. The second holding member has an opening 13a in its radially inner region that exposes the front face S1, the surface of the substrate W to be plated. The second holding member 13 can be opened and closed by a hinge 14 against the first holding member 12. The opening/closing mechanism for the substrate holder 11 is not limited to the hinge and may instead be configured to dispose the second holding member 13 at a position opposed to the first holding member 12 and open and close the second holding member 13 by moving it forward and backward relative to the first holding member. The hangers 15 are attached to opposite ends of one side of the first holding member 12. At least one of the hangers 15 is provided with an external connection terminal for connection with an external circuit (e.g., a power source). The hangers 15 need not be made of a transparent material and may have a conventional structure.

In the example of FIG. 2A, the first holding member 12 (or a base), entirely made of a transparent portion, permits the observation (visual inspection, imaging) and monitoring of the back face S2 of the substrate W through the first holding member 12 while the substrate W is held in the substrate holder 11. The example of FIG. 2A shows a fracture 16 (e.g., including a crack) in the back face S2 of the substrate W. This fracture 16 in the back face S2 of the substrate W can be observed through the transparent first holding member 12. Also, any leak of processing solution into the interior space of the substrate holder 11, including an outer interior space $\alpha$ and an inner interior space $\beta$ (described later with reference to FIGS. 5A to 5C), can be observed.

Figure 2B:
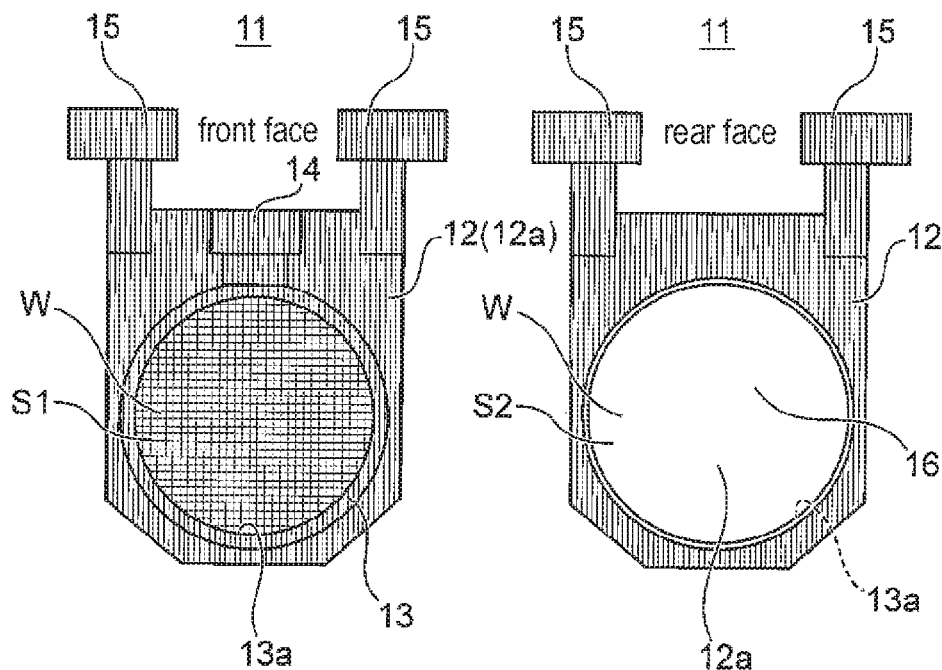
FIG. 2B shows another example of the substrate holder.

FIG. 2B shows another example of the substrate holder. In the example of FIG. 2B, instead of the entirety of the first holding member 12, only the region of the first holding member 12 that corresponds to the back face S2 of the substrate W or only the region of the first holding member 12 (including the region corresponding to the back face S2 of the substrate W) inward of an outer edge of a sealing member 60 (FIGS. 5A to 5C), including the outer interior space $\alpha$ and the inner interior space $\beta$, is formed as a transparent portion 12a. This first holding member 12 can be made, for example by forming the transparent portion 12a and the remainder of the first holding member 12 separately and subsequently joining them by bonding with adhesive, welding, or the like. An alternative method may be to provide the first holding member 12 with an opening and mold a material in the opening (e.g., by injection molding or transfer molding) to form the transparent portion 12a in the first holding member 12. Alternatively, the transparent portion 12a and the remainder of the first holding member 12 may be molded. The region corresponding to the back face S2 of the substrate W may be a region corresponding to the opening 13 of the first holding member 12 (a region excluding the periphery of the substrate W, which is to be sealed by the second holding member 13, the region being slightly small in diameter than the substrate W), a region corresponding to the substrate W, or a region being slightly larger than the substrate W. Other details are similar to those of FIG. 2A and are omitted here. In the example of FIG. 2B, the region of the first holding member 12 corresponding to the back face S2 of the substrate W or the region of the first holding member 12 inward of the outer edge of the sealing member 60 (FIG. 5A to 5C), including the outer interior space $\alpha$ and the inner interior space $\beta$, forms the transparent portion 12a, which permits the observation (visual inspection, imaging) and monitoring of the back face S2 of the substrate W through the transparent portion 12a of the first holding member 12, while the substrate W is held in the substrate holder 11. The example of FIG. 2B shows a crack (fracture) 16 in the back face S2 of the substrate W. This crack 16 in the back face S2 of the substrate W can be observed through the transparent portion 12a of the first holding member 12. In the case that the region inward of the outer edge of the sealing member 60 (FIGS. 5A to 5C) forms the transparent portion 12a, any leakage of processing solution into the interior space of the substrate holder 11, including the outer interior space $\alpha$ and inner interior space $\beta$ (FIGS. 5A to 5C), can be observed.

Figure 3A:
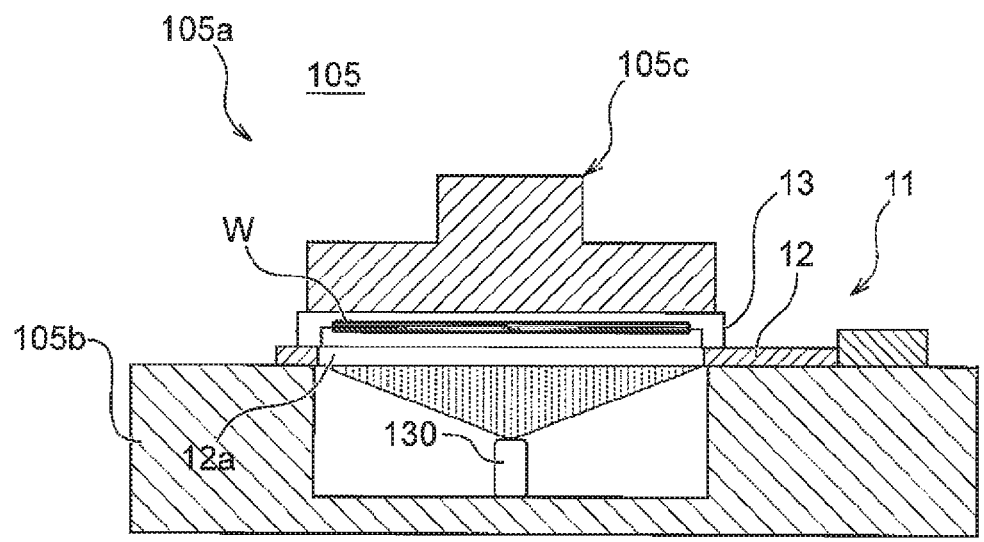
FIG. 3A shows an example of a substrate-holder-interior monitor at a substrate loading/unloading section.
Figure 3B:
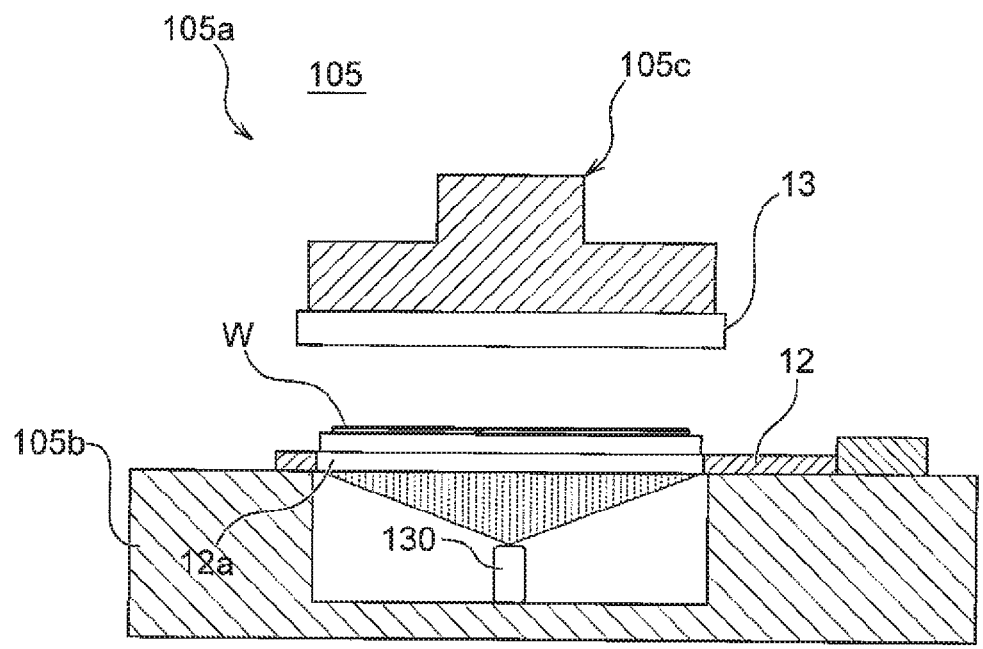
FIG. 3B shows another example of the substrate-holder-interior monitor at the substrate loading/unloading section.

FIGS. 3A and 3B show an example of the substrate-holder-interior monitor at the substrate loading/unloading section. In this example, the substrate holder 11 takes a horizontal posture for the substrate W to be mounted and dismounted. Alternatively, the substrate holder 11 may be configured to take a vertical posture for the substrate loading/unloading.

The substrate loading/unloading device 105a at the substrate loading/unloading subsection 105 comprises: a fixing table 105b on which the substrate holder 11 sits; and a fixing head 105c for opening and closing the substrate holder 11. FIG. 3A shows the substrate holder 11 in closed state, with the second holding member 13 being pressed against the first holding member 12 by the fixing head 105c. FIG. 3B shows the substrate holder 11 in open state in which the fixing head 105c releases or lifts the second holding member 13 from the first holding member 12 so that the substrate holder 11 is opened. These figures schematically show the opening/closing of the substrate holder 11. In practice, with the substrate holder 11 of FIGS. 2A and 2B, the second holding member 13 pivots around the hinge 14 to open and close. In the case of a mechanism for opening and closing the substrate holder 11 with the second holding member 13 being opposed to the first holding member 12 and moved toward and away from it, the movement is similar to that shown in FIGS. 3A and 3B.

An imaging device 130, serving as a substrate-holder-interior monitor, is placed in a recess in the fixing table 105b. The imaging device 130 may be an imaging sensor such as a camera, or an optical sensor for detecting the reflectance of the substrate and/or the substrate holder. For image recognition, in many cases, the camera is preferably a black-and-white one, but a color camera may be used instead. The imaging device 130 may be adapted to move horizontally or vertically in the recess. The imaging device 13 is opposed to the transparent portion 12a of the first holding member 12 of the substrate holder 11 when the substrate holder 11 is placed on the fixing table 105b. The imaging device 130 images the back face S2 of the substrate W through the transparent portion 12a of the first holding member 12. Images taken may be stationary or moving ones. It suffices to detect defects in the substrate and/or the substrate holder at each timing. As shown in FIGS. 3A and 3B, the imaging device 130 is capable of imaging the back face S2 of the substrate W through the transparent portion 12a of the first holding member 12, whether the substrate holder 11 is closed (FIG. 3A) or opened (FIG. 3B). In addition or instead, the imaging device may be placed at a position that permits it to image the front face S1 of the substrate W when the substrate holder 11 is opened (FIG.

3B), so as to image the front face S1 of the substrate W when the substrate holder 11 is opened.

FIG. 4 shows an example of the substrate-holder-interior monitor of the transport device. It is to be noted that the details of the second transporter 115 described here also apply to the first transporter 114. As shown in FIGS. 1 and 4A, the second transporter 115 comprises: a base 144 movably placed on a rail 116 (along y-axis); a support column 141 mounted on the base 144; and an arm 142 attached to the support column 141 to extend in a direction (along x-axis) across the direction of movement. The arm 142 is provided with a gripper 143 that holds the substrate holder 11. In this example, the arm 142 has a plurality of grippers 143 to hold two substrate holders 11 side by side (FIG. 1). There may be one or three or more substrate holders 11 held by the arm 142 to suit device configuration. The second transporter 115 may use the grippers 143 to hold and release the substrate holders 11. The second transporter 115 is of linear motor type that is movable between the stocker 107 and processing tanks as the base 144 moves along the rail 116. The arm 142 is moved vertically relative to the support column 141 by an unillustrated vertically moving mechanism (ball/screw mechanism, rack/pinion mechanism, or the like) to carry the substrate holders 11 into and out of the stocker 107 and processing tanks. Similarly, the first transporter 114 is also of linear motor type that is movable between the substrate loading/unloading subsection 105 and the stocker 107 as the base 144 moves along the rail 116. The arm 142 is moved vertically relative to the support column 141 by an unillustrated vertically moving mechanism (ball/screw mechanism, rack/pinion mechanism, or the like) to carry the substrate holders 11 into and out of the substrate loading/unloading subsection 105 and the stocker 107.

The imaging device 130, serving as a substrate-holder-interior monitor, is held in a holder 131, which is attached via a vertically moving mechanism 132, a front/back moving mechanism 133, and a transversely moving mechanism 134 to the arm 142 of the second transporter 115. The vertically moving mechanism 132 uses a drive mechanism, such as a ball/screw mechanism or a rack/pinion mechanism, to move the imaging device 130 in the vertical direction (z-axis) relative to the substrate holders 11 held in the second transporter 115. The front/back moving mechanism 133 also uses a drive mechanism, such as a ball/screw mechanism or a rack/pinion mechanism, to move the imaging device 130 in the front/back direction (y-axis) relative to the substrate holders 11 held in the second transporter 115. The transversely moving mechanism 134 also uses a drive mechanism, such as a ball/screw mechanism or a rack/minion mechanism, to move the imaging device 130 in the transverse direction (x-axis) relative to the substrate holders 11 held in the second transporter 115. By moving the imaging device 130 in the vertical and front/back directions, the imaging device 130 are moved between the imaging position where the imaging device 130 images the substrate holders 11 and the retracted position to which the imaging device 130 are retracted when the substrate holders 11 are brought into a processing tank. By moving the imaging device 130 to the right and left, the two substrate holders 11 held side by side on the arm 142 of the second transponder 115 can be imaged in sequence by the single imaging device 130. Alternatively, a plurality of imaging devices 130 are attached to the second transporter 115 via each moving mechanism, so that each imaging device 130 can image each of the substrate holders 11. Similar details apply to the substrate-holder-interior monitor (imaging device and its moving mechanism) for the first transporter 114.

FIG. 4B shows another example of the substrate-holder-interior monitor of the transporting device. In the previous example, the substrate-holder-interior monitor is fitted to the second transporter 115. Alternatively, as shown in FIG. 4B, the substrate-holder-interior monitor may be fitted to a moving mechanism 135 independent of the second transporter 115. In this case, the moving mechanism 135 may be movably disposed on the rail 116. In this example, the imaging device 130 is attached via the vertically moving mechanism 132, front/back moving mechanism 133, and right/left moving mechanism 134 to the moving mechanism 135. The moving mechanism 135 is driven by a linear motor or other drive and comprises: a base 137 movably placed on a rail 116 (along y-axis); and a support column 136 to which the right/left moving mechanism 134 is fitted, the support column 136 being mounted on the base 137. As in the case of the first and second transporters 114, 115, an arm may be fitted to the support column 136 to extend in a direction (x axis) across the direction of movement, the arm being provided with the right/left moving mechanism 134.

Example of the Substrate Holder and Other Details

The above examples relate to the observation (visual inspection, imaging) of the back face S2 of the substrate W in the substrate holder 11. Alternatively, observation may be made of a radially outer interior space (outer interior space) of the substrate W in the substrate holder 11. This also permits the detection of any leak of processing solution into the substrate holder 11. This observation is more likely than the observation of the substrate back face S2 to detect any defects in the substrates and/or the substrate holding members at early stage. It is also possible to combine the observation of the substrate back face S2 and the observation of the outer interior space of the substrate holder.

Figure 5B:
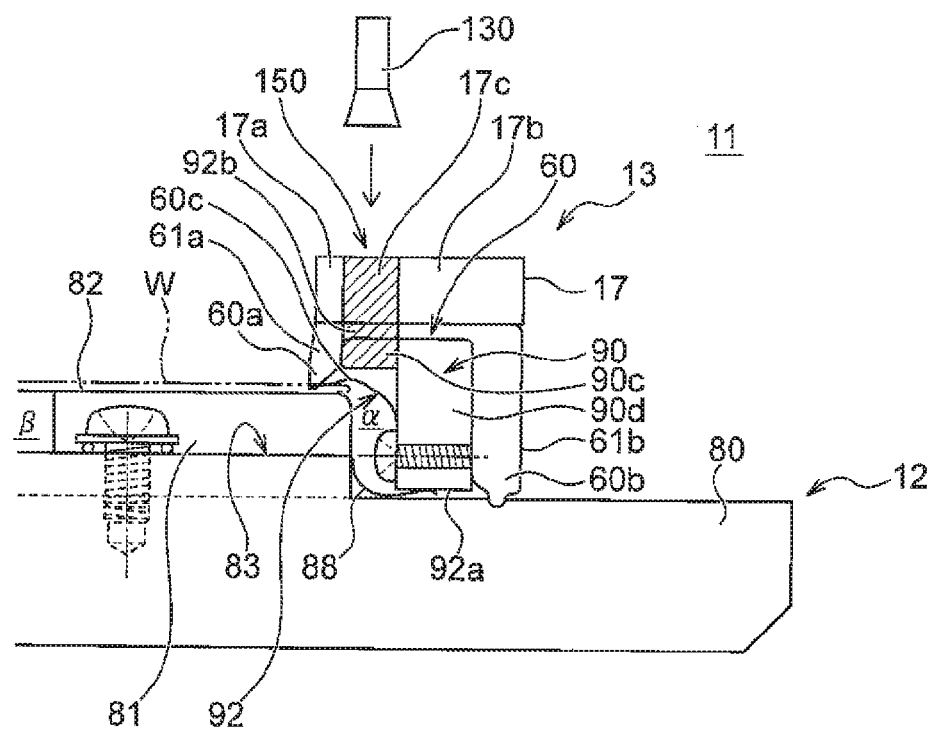
FIG. 5B shows still another example of the substrate holder.
Figure 5C:
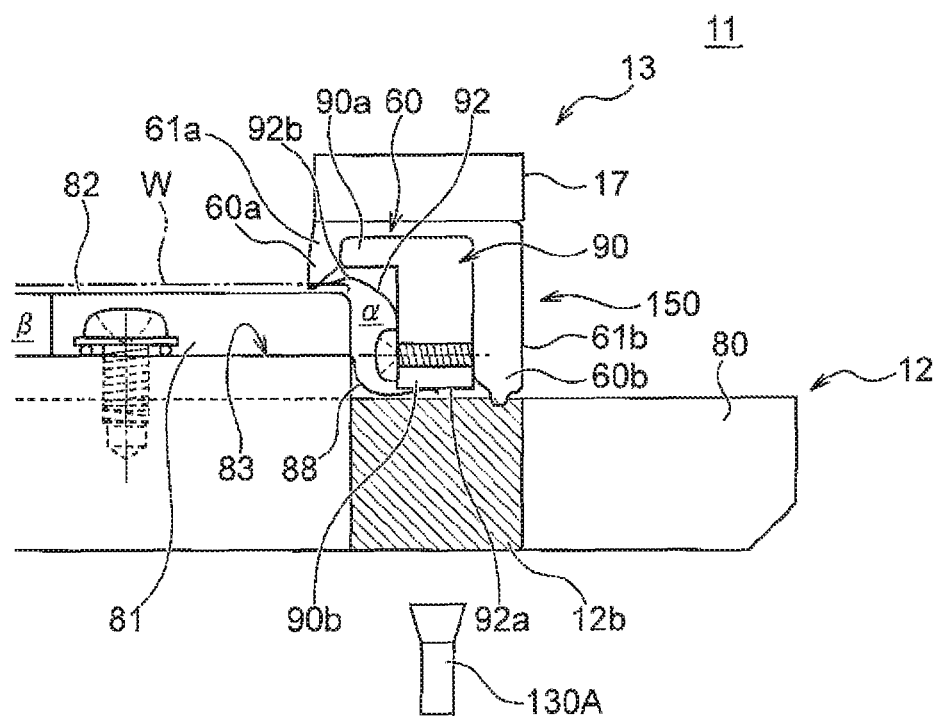
FIG. 5C shows still another example of the substrate holder.

FIGS. 5A to 5C show another example of the substrate holder. These figures show that with the substrate W mounted on the first holding member 12 of the substrate holder 11, the second holding member 13 is closed against the first holding member 12 to hold the substrate W between the first holding member 12 and the second holding member 13 of the substrate holder 11. In the example of FIGS. 5A to 5C, part of the second holding member 13 and/or part of the first holding member 12 of the substrate holder 11 forms a transparent portion 150, 12b. The imaging devices 130, 130A image through the transparent portion 150, 12b a sealed space (outer interior space α) between lips 60a and 60b on inner and outer circumferential sides of the sealing member 60 of the substrate holder 11.

In the example of FIGS. 5A to 5C, there may be one or more transparent portions 150, 12b. The one or more transparent portions 150, 12b may be provided at any points in the circumferential direction of the second holding member 13. The transparent portions 150, 12b may extend along the entire circumference of the second holding member 13. Such transparent portions 150, 12b are disposed in an annular configuration along the second holding member 13. Alternatively, the second holding member may be transparent in its entirety. In FIGS. 5A to 5C, the transparent portions 150, 12b may be placed at a position corresponding to an electrical contact 92 and/or other position. The transparent portions 150, 12b of FIGS. 5A and 5B, when they are placed at a position corresponding to the electrical contact 92 (i.e., the transparent portions 150, 12b are placed at the section of the first holding member 12 or the second holding member 13 facing the outer interior space α where the electrical contact 92 is positioned) or extending along the entire circumference, are suitable for observing any corrosion of the electrical contact 92 or any discoloration at the contact between the electrical contact 92 and the substrate W. In the case that the substrate holder 11 is processed and transported upright (see FIG. 4A), the transparent portions 150, 12b may be provided at or near the bottommost of the outer interior space α of the substrate holder 11. This can improve the accuracy in leak detection, since leaking processing solution often accumulates at or near the bottommost of the outer interior space α of the substrate holder 11.

The design of FIGS. 5A to 5C is applicable to the above-described substrate loading/unloading subsection 105 and the substrate-holder transport device 113. It is possible to combine in any suitable manner the first holding member 12 of the substrate holder 11 that is partly or wholly transparent (FIGS. 2A, B), the second holding member 13 that is partly or wholly transparent (FIGS. 5A, B), the portion of the first holding member 12 corresponding to the outer interior space α that forms a transparent portion (FIG. 5C).

The first holding member 12 of the substrate holder 11 comprises a base 80 and an annular ridge 81 on the base 80. The ridge 81 serves as a support base for the substrate W and has an end face that functions as a support face 82 for the substrate W. In plan view, the ridge 81 has one or more recesses 83 disposed in circumferential direction. An electrical conductor 88 is fastened by bolts or other fastening members to the bottom of the recess(es) 83. The electrical conductor 88 is electrically connected at one end to one of external connection contacts provided on one or both of the hangers 15 via a cable. In plan view, the other end of the electrical conductor 88 projects radially outward of the ridge 81. The ridge 81 may be formed as a separate member from the base 80 and attached to the base 80, or formed integral with the base 80. Alternatively, the ridge 81 may be configured to be formed as a separate member and to move relative to base 80 by means of elastic material so as to take up or absorb variations in thickness of the substrate W.

The second holding member 13 comprises an annular base 17, a support 90, and a sealing member 60 fixedly held between the base 17 and the support 80. The sealing member 60 comprises: a lip 60a serving as a substrate seal for sealing at inner circumferential side between the substrate W and the second holding member 13; and a lip 60b serving a as a holder seal for sealing at outer circumferential side between the first holding member 12 and the second holding member 13. The lips 60a, 60b of the sealing member 60 seal the outer circumference and the back face S2 of the substrate W. The space thus sealed will be referred to as the interior or the interior space of the substrate holder 11. The interior or interior space of the substrate holder 11 comprises an outer interior space α on the outer circumferential side of the substrate W and an inner interior space β on the back face S2 side of the substrate W. The lip 60b corresponds to the outer edge of the sealing member 60.

The support 90 is provided with an electrical contact 92 for electric current supply to the substrate W, the electrical contact 92 being fastened by bolts or other fastening members to the support 90. The electrical contact 92 has a leg 92a and a contact end 92b. The leg 92a is in contact with the electrically conductor 88 of the first holding member 12 when the second holding member 13 is closed against the first holding member 12, so as to electrically connect the electrical conductor 88 and the electrical contact 92. The contact end 92b, elastic like a laminar spring, comes into contact with the outer circumference of the substrate W when the second holding member 13 is closed against the first holding member 12, so as to connect electrically the electrical contact 92 and the substrate W. In this way, an external connection contact at at least one of the hangers 15 is electrically connected to the substrate W via the electrical conductor 88 and the electrical contact 92 to deliver current from an external power source via the external connection contact, the electrical conductor 88, and the electrical contact 92 to the wafer W.

In the example of FIG. 5A, the transparent portion 150 is provided at a position in the second holding member 13 that will permit sideways observation of the outer interior space α in the substrate holder 11. The transparent portion 150 of FIG. 5A is provided, for example, in the following manner. The sealing member 60 and the support 90 are provided with one or more openings for the transparent portion(s) 150, and the transparent portion(s) 150 are then inserted and fastened in the one or more openings in the sealing member 60 and the support 90. This fastening may be achieved by boding with adhesive, welding or the like, or fastening with a fastening member(s), or other suitable securing means. In this case, the transparent portion 150 may be a single-piece member or a combination of members.

The transparent portion 150 may be divided into a transparent part 60c and a transparent part 90c. In this case, the sealing member 60 is provided with one or more openings for a transparent part(s) 60c, and the transparent part(s) 60c are inserted and fastened in the one or more openings in the sealing member 60. Similarly, the support 90 is provided with one or more openings for a transparent part(s) 90c, and the transparent part(s) 90c are inserted and fastened in the one or more openings in the support 90. This fastening may be achieved by boding with adhesive, welding or the like, or fastening with a fastening member(s), or other suitable securing means. Alternatively, a material for the transparent part(s) 60c and the transparent part(s) 90c may be molded (e.g., injection-molded or transfer-molded) in the one or more openings in the sealing member 60 and the support 90 to form the transparent part(s) 60c and the transparent part(s) 90c. Alternatively, the parts (transparent part(s) 60c and the remainder) of the sealing member 60 may be molded. The parts (transparent part(s) 90c and the remainder) of the support 90 may be molded.

To form the transparent portion 150 along the entire circumference of the second holding member 13, a transparent portion 150 may be provided in the sealing member 60 and the support 90 in the following manner. The sealing member 60 comprises: an inner seal 61a having a lip 60a; an outer seal 61b having a lip 60b; and a transparent part 60c, which are separate components fastened to each other. This fastening may be achieved by boding with adhesive, welding or the like, or fastening with a fastening member(s), or other suitable securing means. In this case, the inner seal 61a and the outer seal 61b may each be formed of separate pieces. The support 90 comprises a proximal portion 90a, a distal portion 90b, and a transparent part 90c, which are separate components fastened to each other. This fastening may be achieved by boding with adhesive, welding or the like, or fastening with a fastening member(s), or other suitable securing means. Instead of forming the transparent portion 150 from the separate transparent parts 60c and 90c, the transparent portion 150 may be an integrally formed piece of transparent portion. To this integrally formed piece of transparent portion 150 may be fixed the inner seal 61a and the outer seal 61*b* of the sealing member 60 and the proximal portion 90*a* and the distal portion 90*b* of the support 90.

The imaging device 130 is located on the radially outside of the substrate holder 11 at a position opposed to the transparent portion 150 to image the interior of the substrate holder 11 (in this example, the outer interior space α). The imaging device 130 may be provided with a moving mechanism to move between the position that allows the imaging device 130 to image the interior of the substrate holder 11 and a retracted position that does not interfere with the opening/closing of the substrate holder 11 and the movement of the first and second transporters 114, 115. A moving mechanism, which will allow the imaging device 130 to move along the circumferential direction of the second holding member 13, may be provided.

In the example of FIG. 5A, the imaging device 130 images the outer interior space α sealed between the lips 60*a* and 60*b* on the inner and outer circumferential sides of the sealing member of the substrate holder 11, through one or more transparent portions 150 provided on the outer circumferential surface of the second holding member 13. Images taken may be stationary or moving ones. Image data taken by the imaging device 130 are used to determine the presence of any leak of processing solution into the outer interior space α. In addition to the presence or absence of leak, the extent of leak may be determined.

In the example of FIG. 5B, the transparent portion 150 is disposed at a position in the second holding member 13 that permits the observation of the outer interior space α from the front side of the substrate holder 11, the position being opposed to the first holding member 12. The imaging device 130 is directed toward the first holding member 12 to image the outer interior space α in the substrate holder 11 through the transparent portion 150 at the proximal portion face (the top face as viewed in FIGS. 5A, 5B) of the second holding member 13. Image data taken by the imaging device 130 are used to determine the presence of any leak of processing solution into the sealed space α. In addition to the presence or absence of leak, the extent of leak may be determined. Images taken may be stationary or moving ones.

The transparent portion 150 of FIG. 5B is provided, for example in the following manner. The base 17 and the sealing member 60 are provided with one or more openings for the transparent portion 150, and the support 90 is provided with one or more notches for the transparent portion 150, and the transparent portion(s) 150 are then inserted in the openings and notches and are fastened to the base 17, the sealing member 60, and the support 90. The support 90 is annular in plan view and provided with one or more notches for the transparent part(s) 90*c*, the notch(es) being open on the radially inner side. This fastening may be achieved by boding with adhesive, welding or the like, or fastening with a fastening member(s), or other suitable securing means. The transparent portion 150 may be a single-piece member or a combination of members.

The transparent portion 150 may be comprised of a transparent part 17*c*, a transparent part 60*c*, and a transparent part 90*c*. In this case, the base 17 is provided with one or more openings for the transparent part(s) 17*c*, and the transparent part(s) 17*c* are then inserted and fastened in the one or more openings in the base 17. The sealing member 60 is provided with one or more openings for the transparent part(s) 60*c*, and the transparent part(s) 60*c* are then inserted and fastened in the one or more openings in the sealing member 60. The support 90 is provided with one or more notches for the transparent parts 90*c*, and the transparent part(s) 90*c* are then inserted and fastened in the notch(es) in the support 90. This fastening may be achieved by bonding with adhesive, welding or the like, or fastening with a fastening member(s), or other suitable securing means. Alternatively, materials for the transparent part(s) 17*c*, the transparent part(s) 60*c*, and the transparent part(s) 90*c* may be molded (e.g., injection-molded or transfer-molded) in the one or more openings in the base 17, the one or more openings in the sealing member 60 and the one or more notch(es) in the support 90, respectively, to form the transparent part(s) 17*c*, the transparent part(s) 60*c*, and the transparent part(s) 90*c*. Alternatively, the parts (transparent part(s) 17*c* and the remainder) of the base 17 may be molded. The parts (transparent part(s) 60*c* and the remainder) of the sealing member 60 may be molded. The parts (transparent part(s) 90*c* and the remainder) of the support 90 may be molded.

To form the transparent portion 150 along the entire circumference of the second holding member 13, the transparent portion 150 may be provided in the base 17, the sealing member 60, and the support 90 in the following manner. The base 17 comprises: an inner circumferential part 17*a*; an outer circumferential part 17*b*; and a transparent part 17*c*, which are separate parts fastened to each other. This fastening may be achieved by bonding with adhesive, welding or the like, or fastening with a fastening member(s), or other suitable securing means. The sealing member 60 comprises: an inner seal 61*a* having a lip 60*a*; an outer seal 61*b* having a lip 60*b*; and a transparent part 60*c*, which are separate components fastened to each other. This fastening may be achieved by bonding with adhesive, welding or the like, or fastening with a fastening member(s), or other suitable securing means. The inner seal 61*a* and the outer seal 61*b* may each be formed of further separate pieces. The support 90 comprises an outer circumferential part 90*d* and a transparent part 90*c*, which are separate parts fastened to each other. This fastening may be achieved by bonding with adhesive, welding or the like, or fastening a fastening member(s), or other suitable securing means. The transparent portion 150, instead of comprising the transparent part 17*c*, the transparent part 60*c*, the transparent part 90*c*, may be an integrally formed piece of transparent portion. To this integrally formed piece of transparent portion 150 may be fixed the inner circumferential part 17*a* and the outer circumferential part 17*b* of the base 17, the inner seal 61*a* and the outer seal 61*b* of the sealing member 60, and the outer circumferential part 90*d* of the support 90.

In the example of FIG. 5B, the imaging device 130 images the outer interior space α in the substrate holder 11 through the one or more transparent portions 150 at the proximal portion face of the second holding member 13. Image data taken by the imaging device 130 are used to determine the presence of any leak of processing solution into the sealed space α. In addition to the presence or absence of leak, the extent of leak may be determined. Images taken may be stationary or moving ones.

In the example of FIG. 5C, the portion of the base 80 in the first holding member 12 corresponding to the outer interior space α is formed as a transparent portion 12*b*. Since leaking processing solution often accumulates on the outside of the ridge (support base) 81 in the outer interior space α, the corresponding portion of the base 80 is formed as the transparent portion 12*b*, through which the outer interior space α will be imaged by the imaging device 130. In the case, as in this embodiment, where the substrate holder 11 is processed and transported upright (see FIG. 4A), there is a great tendency that leaking processing solution may accumulate on the outside of the ridge 81 at the bottommost of the outer interior space α in the substrate holder 11. For this reason, it is preferable to provide the transparent portion 12*b* at the corresponding position in the substrate holder 11. The transparent portion 12*b* of FIG. 5C, provided at the position corresponding to the electrical contact 92, is suitable for observing any corrosion of the electrical contact 92 or the electrical conductor 88 or any processing solution itself entering the outer interior space α.

The imaging device 130A images the outer interior space α in the substrate holder 11 through the transparent portion 12*b* in the first holding member 12. Image data taken by the imaging device 130A are used to determine the presence of any leak of processing solution into the sealed space α. In addition to the presence or absence of leak, the extent of leak may be determined. Images taken may be stationary or moving ones.

The transparent portion 12*b* of FIG. 5C is provided, for example in the following manner. The first holding member 12 is provided with one or more openings for the transparent portion(s) 12*b*, and the transparent portion(s) 12*b* are then inserted and fastened in the one or openings in the first holding member 12. This fastening may be achieved by bonding with adhesive, welding or the like, or fastening with a fastening member(s), or other suitable securing means. Alternatively, a material for the transparent portion(s) 12*b* may be molded (e.g., injection-molded or transfer-molded) in the one or more openings in the first holding member 12 to form the transparent portion(s) 12 in the first holding member 12. Alternatively, the parts (transparent portion(s) 12*b* and the remainder) of the first holding member 12 may be molded.

To form the transparent part 12*b* along the entire circumference of the second holding member 13, the first holding member 12 is provided with an annular slit for the transparent portion 12*b*, and the transparent part 12*b* is inserted in the annular slit and thus fastened to the first holding member 12. This fastening may be achieved by bonding with adhesive, welding or the like, or fastening with a fastening member(s), or other suitable securing means. Alternatively, a material for the transparent portion 12*b* may be molded (e.g., injection-molded or transfer-molded) in the annular slit in the first holding member 12 to form the transparent portion 12*b* in the first holding member 12. Alternatively, the parts (transparent part 12*b* and the remainder) of the first holding member 12 may be molded.

At least two of transparent portion 150 of FIG. 5A, the transparent portion 150 of FIG. 5B, and the transparent portion 12*b* of FIG. 5C may be combined. Optionally or additionally, the second holding member 13 may be entirely made of a transparent material.

So far, the base, the sealing member, and the support made partly of a transparent material have been described by way of example; however, one or more of the base, the sealing member, and the support may be entirely made of a transparent material. For example, the base, the sealing member, and the support may be wholly made of a transparent material.

At least two of the transparent portion 12*a* of FIG. 2A or 2B, the transparent portion 150 of FIG. 5A, the transparent portion 150 of FIG. 5B, and the transparent portion 12*b* of FIG. 5C may be combined.

Figure 6:
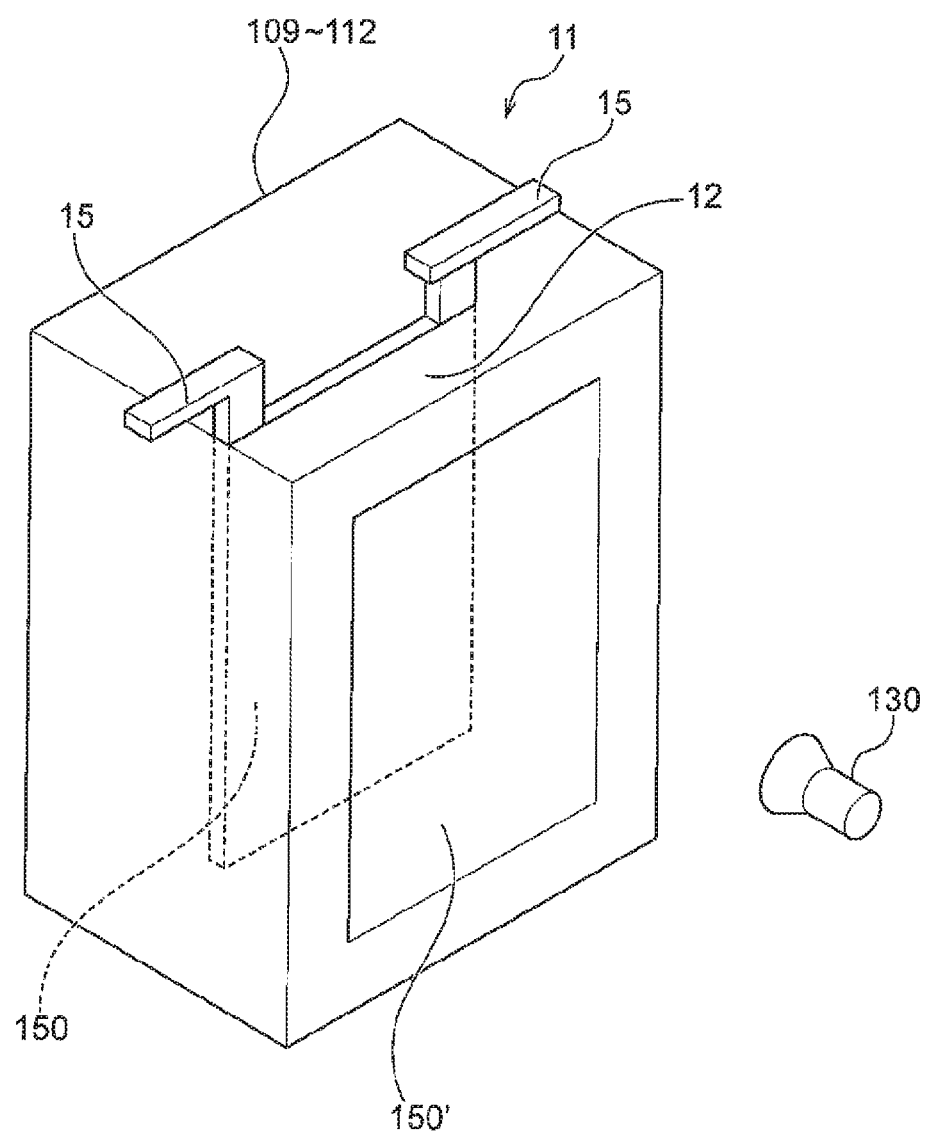
FIG. 6 is an example of a processing tank.

FIG. 6 shows an example of a processing tank. As shown, one or more processing tanks may be provided with a side wall that is partly or wholly made of a transparent material to form a transparent portion 150' to image the interior of the substrate holder 11 while the substrate holder 11 is in the processing tank, through the transparent portion 150' of the processing tank and the transparent portion 150 of the substrate holder 11.

(Control)

Figure 7:
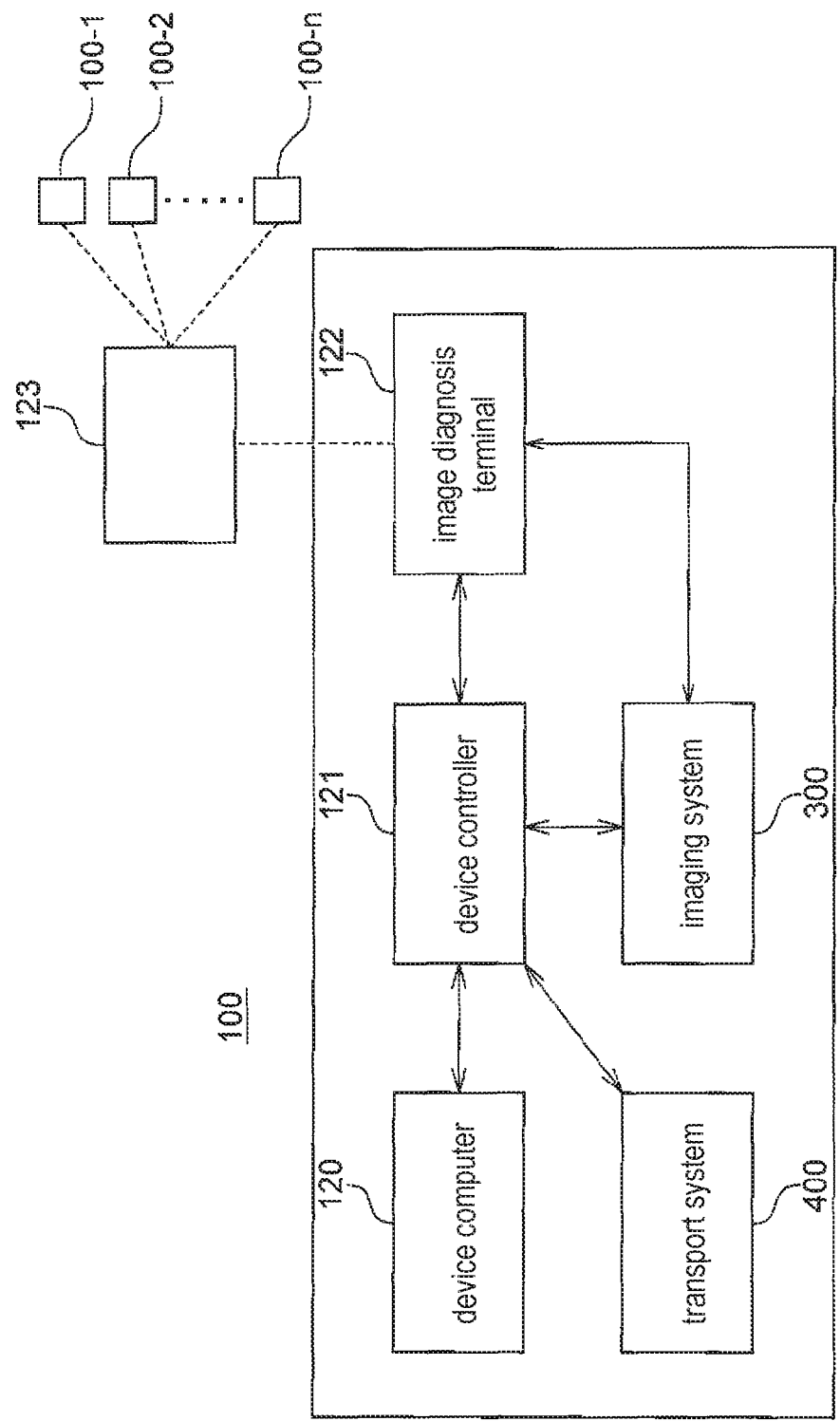
FIG. 7 shows the control of the substrate processing device.

FIG. 7 shows the control of the substrate processing device. The substrate processing device 100 is mainly controlled by a device computer 120, a device controller 121, and an image diagnosis terminal 122. The device computer 120, device controller 121, and image diagnosis terminal 122 cooperate to execute various types of control, such as monitoring control of the interior of the substrate holder (described later), for the substrate processing device 110.

The device controller 121 comprises, for example, a sequencer, etc., and controls the sections of the substrate processing device 100, including a transport system 400 and an imaging system 300, based on control commands and setting parameters from the device computer 120, etc. The transport system 400 includes the substrate transport device 103 and the substrate-holder transport device 113. The imaging system 300 includes the imaging device 130 and its moving mechanisms (131 to 134, etc.).

The image diagnosis terminal 122, as described above, is a computer including memory 122B and a CPU 122A. The image diagnosis terminal 122 performs image recognition processing on the image data taken by the imaging device 130 and diagnoses the state of the substrate W and/or the substrate holder 11. The image diagnosis terminal 122 outputs the presence/absence and/or extent of any defect in the substrate W and/or the substrate holder 11 to the device controller 121. If there is any defect in the substrate W and/or the substrate holder 11 or its extent is greater than a set threshold, the device controller 121 outputs an alarm to the device computer 120.

The image diagnosis terminal 122 may be linked via wire or wirelessly to an external server for the substrate processing device 100. In this case, the image diagnosis terminal 122 extracts or computes features (shade/tint of image, gradation contour, color variations, color variation contour, etc.) from the image data taken by the imaging device 130 and outputs them to the server 123. The server 123 may be configured to perform image diagnosis processing and send the result of image diagnosis to the image diagnosis terminal 122, based on the features (feature amounts) of image data received from the image diagnosis terminal 122. One or a plurality of substrate processing devices 100-1 to 100-*n*, other than the substrate processing device 100, may be linked via wire or wirelessly to the server 123 to perform at the server 123 image diagnosis processing on image data collected from one or more of the substrate processing device 100 and 100-1 to 100-*n* and send the result of image diagnosis to the image diagnosis terminal 122.

Deep learning or the like may be employed in the image recognition processing by the image diagnosis terminal 122 and/or the server 123. The image recognition processing may comprise: collecting image data on the substrate W in normal state and/or in abnormal state as teacher data and learning the image data, using a deep neural network (DNN); and estimating a level of abnormality. Prior to designing and/or device operation, a large amount of teacher data may be collected and learned by the image diagnosis terminal 122 beforehand and be incorporated into the device. The level of abnormality may be classified into a plurality of classes: for example, "none," "minor," "light," "intermediate," and "serious." "None" indicates the normal state of the substrate and/or the substrate holder. The image diagnosis may be based, for example, on the area, width, and/or length of a region that is different in shade/tint and/or color in image data. The level of abnormality may be estimated from a numerical value converted from the extent of abnormality on the basis of the area, width, and/or length of a region that is different in shade/tint and/or color of the image data. Whether or not to keep using the substrate and/or substrate holder, to retrieve the substrate and/or substrate holder, etc., may be assigned to each level. Image data on a plurality of substrate holders, together with diagnosis results, may be collected in the server 123, and a monitor may be provided for displaying the state of each substrate holder (diagnosis results, such as the presence/absence of a defect, its level) in an integrated fashion. It is also possible to diagnose the condition of the substrate and/or substrate holder on the part of the substrate processing device by computing features from monitored image data on a large number of substrate holders at a plurality of substrate processing devices, sending the feature data to the server, having a deep neural network (DNN) learn the data, and using the learned DNN parameters. The DNN parameters may include, for example, criteria for determination such as a threshold for determining a presence/absence of a defect and/or level of a defect, etc. The condition of the substrate and/or the substrate holder may also be diagnosed by the server 123 by computing features from monitored image data (including images of the interior space of the substrate holder and the substrate surface) on a large number of substrate holders at a plurality of substrate processing devices, sending the feature data to the server, and having the DNN learn the data. For learning, teacher data may be added in advance to the feature data collected in the server 123. Computers of a plurality of substrate processing device and the image diagnosis server 123 may be connected by a fog or edge computing configuration.

Any substrate holders whose substrates and/or substrate holders are found defective may be notified to the user. In the event of defects found in substrates and/or substrate holders, the substrate holders may be returned as unusable to the stocker after the completion of the ongoing substrate processing or be kept in further use for investigation purposes. In the event of defective substrates and/or substrate holders, the determination not to send the substrate holders to subsequent processing tanks may be made according to the level of diagnosis result. When this determination is made, the substrates will not be subjected to further processing and will be returned to the cassette after the substrate holders are subjected to cleaning, drying, etc. In the event of detecting defective substrate and/or substrate holders, if there is any obstacle to unloading the substrates, it is possible to return the substrate holders with those substrates to the stocker and notify accordingly.

It is also possible to diagnose degradation of the transparent portion of a substrate holder by similar image recognition processing and indicate that it is time to preferably clean or replace that substrate holder. In case that the processing tank is partly or wholly transparent, the degradation of the transparent portion may be diagnosed by similar image recognition processing.

As described above, the image processing device 130 is provided to move with the substrate-holder transporting device 113. Alternatively, one or more imaging devices 130 may be installed at positions that allow them to image the substrate holder 11 in the substrate processing device 100. In this case, the imaging device(s) 130 at the position of installation may be adapted to move between the imaging and the retracted position. The imaging device(s) 130 may be adapted to move between imaging positions opposed to the transparent portions of a plurality of substrate holders.

Control Flow

Figure 8:
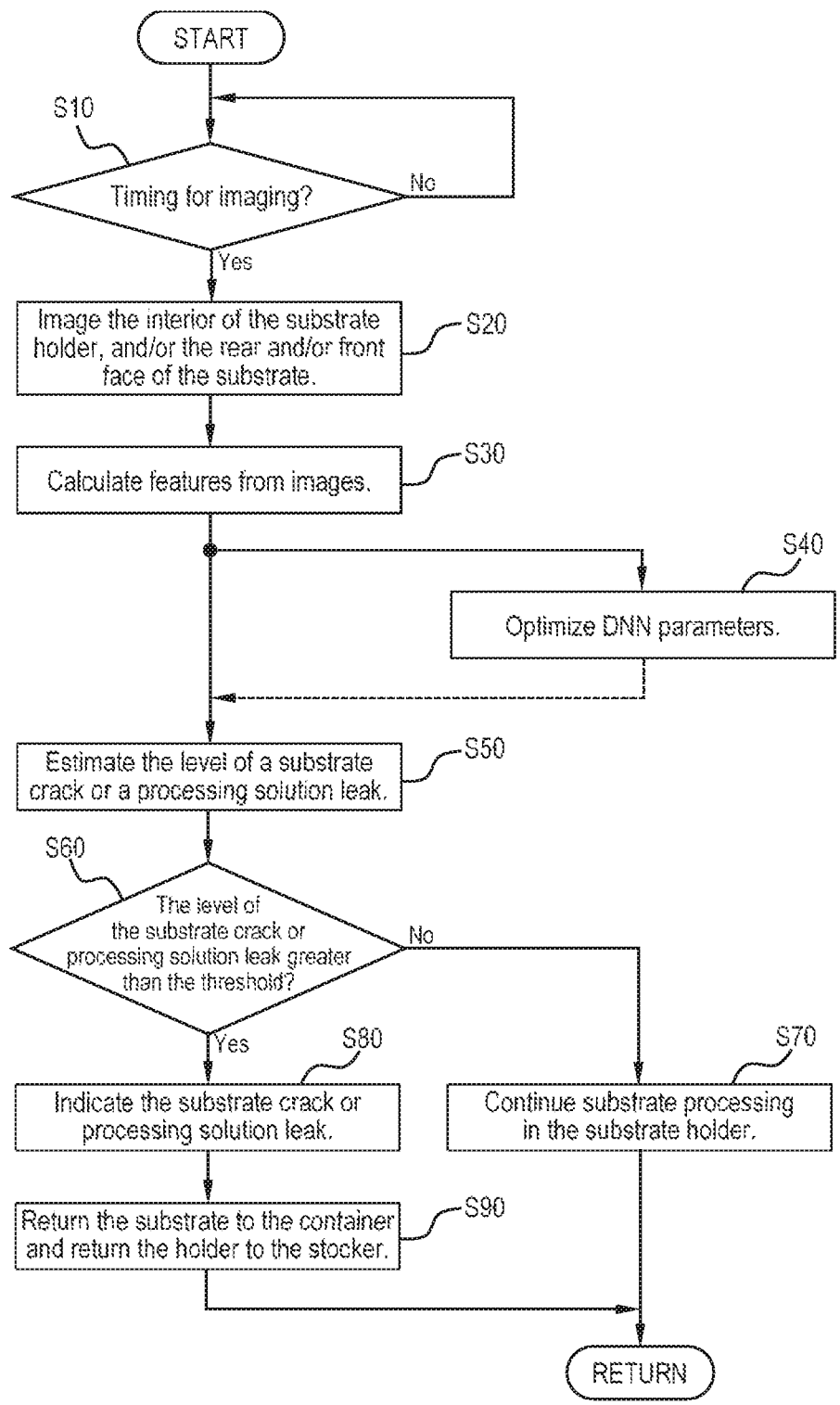
FIG. 8 is a flowchart of substrate-holder-interior monitoring control.

FIG. 8 is a flowchart of the substrate-holder-interior monitoring control.

Step S10 determines whether it is time for the device controller 121 to image the substrate holder 11. If not, step S10 will be repeated until the imaging time.

The imaging time includes at least one or more of the following:

(1) before and after the second holding member 13 is closed at the time of mounting the unprocessed substrate W in the substrate holder 11 at the substrate loading/unloading subsection 105, with the substrate W mounted on the first holding member 12 (FIGS. 3A, 3B);

(2) before and after releasing the second holding member 13 from the first holding member 12 with the substrate W at the time of removing the processed substrate W from the substrate holder 11 at the substrate loading/unloading subsection 105 (FIGS. 3A, 3B);

(3) during the transfer of the substrate holder 11 by the first or second transporter 114, 115 (FIGS. 4A, 4B);

(4) the time when the substrate holder 11 is removed from each processing tank by the second transporter 115 (FIGS. 4A, 4B);

(5) during the processing of the substrate W in each processing tank (FIG. 6); and (6) the time when the substrate holder 11 is removed from the stocker 107 by the first transporter 114 (FIGS. 4A, 4B).

Upon determining that any of the times have been reached in step S10, the process proceeds to step S20, in which the device controller 120 controls an imaging system 300 to image the interior of the substrate holder 11 through the transparent portions 12a, 12b, 150 of the substrate holder 11. This imaging includes one or more of: imaging the back face S2 of the substrate W through the back of the substrate holder 11 at the times (1) to (6) (FIGS. 3A, B, FIGS. 4A, B); and imaging the outer interior space α and the inner interior space β of the substrate holder 11 at the times (1) to (6) (FIGS. 5A, B). In the case of imaging the interior of the substrate holder 11 during the processing of the substrate W in each processing tank (in the case of (5)), as shown in FIG. 6, the interior of the substrate holder 11 is imaged through the transparent portion 150' of the processing tank and the transparent portions 12a, 12b, 150 of the substrate holder 11. The outer interior space α may be imaged in a plurality of directions, for example, the imaging directions shown in FIGS. 5A and 5B. In the case of imaging the interior of the substrate holder 11 of FIGS. 2A, 2B from the first holding member 12 side of the substrate holder 11, not holding the substrate W, the inner interior space β (FIGS. 5A, B) and the outer interior space α of the substrate holder 1 will be imaged.

In step S30, the image diagnosis terminal 122 computes features from the image data taken. The features include the shade/tint and shade/tint contour (and/or color variation, color variation contour) of images of the back face S2 of the substrate W and the outer interior space α and the inner interior space β. The image diagnosis terminal 122 may send image data taken to the server 123 to compute the features from the image data.

In step S40, the image diagnosis terminal updates and optimizes DNN parameters, using pre-stored image data or features (feature amounts) of image data and the features of image data obtained in step S30. The DNN parameters include determination criteria, such as a threshold for defect-level determination for determining the presence/absence of defects and/or the level of defects in substrates and/or substrate holders. The image diagnosis terminal 122 may send image data or computed features to the server 123 to update and optimize the DNN parameters, using pre-stored image data or the features of image data and newly transmitted image data or computed features. The server 123 may compute features from image data.

In step S50, the image diagnosis terminal 122 estimates the presence/absence of any defects and/or defect level in substrates and/or substrate holders from features computed from the image data taken, using the pre-stored DNN parameters or the DNN parameters optimized by the image diagnosis terminal 122 or the server 123 in S40. Such defects in the substrate W include a crack in the substrate W and a leak of processing solution into the substrate holder 11. Defects in the substrate holder 11 include a leak of processing solution (caused by degradation of a sealing member, etc.). Processing solutions include those (pure water, etching solution, plating solution, etc.) in the pre-wet tank 108, pre-soak tank 109, pre-rinse tank 110a, blow tank 111, rinse tank 110b, and plating tank 112a. The defect may be classified for each type (substrate crack, leak), for example into a plurality of levels: "none" (no defect), "minor," "light," "intermediate," and "serious." The image diagnosis terminal 122 outputs a result of diagnosis to the device controller 121, which, in turn, sends it to the device computer 120.

In step S60, the image diagnosis terminal 122 determines for each defect type whether the level of defects in substrates and/or substrate holders (cracks in the substrates W, processing solution leakage) exceeds a threshold and sends the result of diagnosis to the device controller 121. The threshold is set for each defect type to a value that requires user notification. For example, the threshold may be, of the above-described plurality of levels, "intermediate" or "serious."

If step S60 determines that the defect level of substrates and/or substrate holders are below the threshold, the device controller 121, upon receiving the result of diagnosis, continues the substrate processing using that substrate holder 11 (step S70), and the process returns to step S10.

If step 60 determines that the defect level of any of the types of defect in the substrates or substrate holders exceed the threshold, the device controller 121, upon receiving the result of diagnosis, will set off the alarm to indicate the defect in the substrate W (crack in the substrate W, processing solution leak) (step S80). In step S90, the device controller 121 controls a transport system 400 to return the substrate W to the cassette, and the substrate holder 11 to the stocker 107, and the process will return to step S10.

This embodiment, which permits the observation/monitoring of the interior of the substrate holder and the substrate through the transparent portion of the substrate holder, makes it possible to detect when in the processing by the substrate processing device a defect occurs in the substrate and/or substrate holder and thus reduces the time it takes to identify the cause of the defect.

Since it is possible to stop bringing the substrate holder into subsequent processing tanks or other portions upon detecting a defect, this will obviate the entry of fragments from the substrate into the subsequent processing tanks or the like and the contamination of the subsequent processing tanks with leaking processing solution.

Combining the imaging of the back of the substrate in the substrate holder and the imaging of the outer interior space in the substrate holder will permit earlier detection of leaking processing solution than detection by monitoring any one of the imagining results and improve the accuracy in defect detection. Imaging the outer interior space α of the substrate holder in several directions (FIGS. 5A, B) will improve the accuracy of image recognition in the outer interior space.

Other Embodiments

The above embodiment was described in terms of a substrate holder for one-side plating that holds a disk wafer, but can be applied to substrate holders for holding substrates of polygonal or other shape or substrate holders for plating both sides of substrates of any shape by using a transparent portion to form part of the substrate holder.

The above embodiment relates to the imaging of the interior of the substrate holder through the transparent portion, but it is also possible to diagnose the condition of (detect a defect in) the front face S1 of the substrate imaged when the substrate holder is open (as in FIG. 3B), through image recognition processing similar to the one described above, or to diagnose such condition (detect a defect) by combining images taken of the substrate back face and the inner and outer interior spaces of the substrate holder with an image taken of the substrate front face S1. For example, imaging the substrate front face S1 when the substrate holder 11 is opened after plating makes it possible to detect any leak of processing solution into the surroundings of the substrate with improved accuracy.

At least following technical concept can be recognized from the above embodiments.

The first embodiment provides a substrate holding member comprising a first holding member, a second holding member that cooperates with the first holding member to hold the substrate therebetween, and a transparent portion provided in at least one of the first and second holding members (or substrate holding member being at least in part made of a transparent portion).

This embodiment makes it possible to observe/monitor the interior of the substrate holding member and/or the substrate surface in the substrate holding member through the transparent portion to detect any defects in the substrate and/or the substrate holder. This also permits the observation/monitoring of the interior of the substrate holding member at one or more places in the substrate processing device. This also permits the observation/monitoring of the interior of the substrate holding member and/or the substrate in the substrate holding member through the transparent portion at one or more appropriate times and/or places in the substrate processing device. Since it is possible to determine the time when any defect occurs in the substrate and/or the substrate holding member, this will reduce the time it takes to identify the cause of the defect and will improve productivity with the device. Since it is possible to stop bringing the substrate holding member into subsequent processing tanks upon detecting a crack in the substrate, this will obviate entry of substrate fragments into the subsequent processing tanks. Preventing the entry of the substrate holding device into subsequent processing tanks upon detecting a leak of processing solution into the substrate holding member obviates contamination of the subsequent processing tanks with the leaking processing solution. This also prevents corrosion of the portion of the substrate and the substrate holding member that has come into contact with the leaking processing solution. The observation/monitoring of the substrate surface in the substrate holding member may be combined or replaced with observation/monitoring of a substrate surface exposed from the substrate holding member. This embodiment is applicable to substrate holding members for substrates of circular, polygonal, or any other shape.

In the second embodiment, the substrate holding member of the first embodiment is configured so that the transparent portion permits the observation therethrough of the interior of the first holding member and/or the second holding member. In this embodiment, the transparent portion is set to a sufficient transparency to observe the interior of the substrate holding member. This permits the observation/monitoring through the transparent portion of the interior of the substrate holding member and the substrate surface in the substrate holding member.

In the third embodiment, the substrate holding member of the first embodiment is provided with an opening in the second holding member to expose a first surface of the substrate and so configured that the transparent portion is provided at least at a position in the first holding member, the position corresponding to a second surface of the substrate opposite to the first surface. This permits the observation/monitoring of the back face of the substrate received in the substrate holding member while the substrate is held in the substrate holding member.

The first holding member comprises a base and a support provided on the base, the support having a support surface for supporting the substrate. The base may be wholly made of the transparent portion. This base, wholly made by transparent material, will facilitate manufacture.

The support may also be formed as a transparent portion. This support, also transparent, will permits the observation/monitoring of the entire substrate back face up to its outer circumferential edge.

In the fourth embodiment, the substrate holding member of the first embodiment is configured so that the second holding member comprises a first seal for sealing between the substrate and the second holding member and a second seal for sealing between the first and second holding members and that the transparent portion is provided in the first holding member and/or the second holding member to permit the observation of the space sealed by the first and second seals.

This embodiment permits the observation/monitoring of the space (outer interior space) on the outside of the substrate in the substrate holding member.

The transparent portion may be provided in a position in the second holding member that permits observation of the space sealed by the first and second sealing members from a position circumferentially outward of the substrate holding member.

This permits the observation/monitoring of the outer interior space of the substrate holding member from a position on the lateral side of the substrate holding member.

The transparent portion may be provided at a position in the second holding member that permits the observation of the space sealed by the first and second sealing members, in the direction from the second holding member toward the first holding member.

This permits the observation/monitoring of the outer interior space of the substrate holding member from the front side of the substrate holding member.

In the fifth embodiment, the substrate holding member of the fourth embodiment is configured so that the transparent portion is at a position corresponding to the bottommost of the sealed space when the substrate holding member is supported upright.

This embodiment permits observation through the transparent portion of the bottommost of the sealed space where leaked processing solution is likely to accumulate when the substrate holding device is processed upright, resulting in an improvement in the accuracy in processing-solution leak detection.

In the sixth embodiment, the substrate holding member of the fourth embodiment is configured so that the transparent portion is provided at a location in the first and/or second holding member corresponding to the electrical contact for supplying current to the substrate.

This embodiment permits the monitoring through the transparent portion of any corrosion of the electrical contact and discoloration of the contact between the electrical contact and the substrate.

The seventh embodiment provides a substrate processing device comprising the substrate holding member of any one of the first to sixth embodiments.

This embodiment brings about similar effects as the first to sixth embodiments.

The eighth embodiment provides a substrate processing device comprising: a substrate holding member for holding a substrate, the substrate holding member including at least in part a transparent portion or being at least in part made of a transparent portion; and an imaging device for imaging the interior of the substrate holding member through the transparent portion of the substrate holding member.

This embodiment brings about the same effect as the first embodiment. The use of the imaging device for observation/monitoring makes it possible to automatically detect any defects in the substrate and/or the substrate holding member through image recognition processing. This embodiment is also applicable to substrate holding members for substrates of circular, polygonal, or any other shape.

In the ninth embodiment, the substrate processing device of the eighth embodiment further comprises a substrate loading/unloading section for mounting and dismounting the substrate to and from the substrate holding member, wherein the imaging device is provided at the substrate loading/unloading section.

This embodiment permits the observation/monitoring of the substrate holding member and/or the substrate at the time when the unprocessed substrate is mounted on the substrate holding member and at the time when the processed substrate is dismounted from the substrate holding member.

In the tenth embodiment, the substrate processing device of the eighth embodiment further comprises a transport device for transporting the substrate holding member, wherein the imaging device is disposed to image the interior of the substrate holding member held on the transport device.

This embodiment permits the observation/monitoring of the substrate and/or the substrate holding member at an appropriate time while the substrate holding member is held on the transport device. The observation/monitoring of the substrate and/or the substrate holding member can be made, for example while the substrate holding member is transported from the substrate loading/unloading section to the stocker or a processing tank, at the time when the substrate is lifted from a processing tank, and while the substrate holding member is transported between the processing tank and the stocker.

In the eleventh embodiment, the substrate processing device of the tenth embodiment is so configured that the imaging device is mounted on the transport device.

This embodiment, with the imaging device being moved by the transport device in the substrate processing device, eliminates the need for providing means for moving the imaging device additionally.

In the twelfth embodiment, the substrate processing device of the tenth embodiment is so configured that the imaging device is fitted to a moving mechanism independent of the transport device.

This embodiment makes it possible to move the imaging device independent of the substrate holding member and its transport means.

In the thirteenth embodiment, the substrate processing device of the eighth embodiment further comprises a processing tank for processing the substrate, the processing tank being made at least partly of a transparent material so that the imaging device images the interior of the substrate holding member through the transparent portion of the processing tank and the transparent portion of the substrate holding member when the substrate holding member is placed in the processing tank.

This embodiment permits the observation/monitoring of the interior of the substrate holding member and/or the substrate in the substrate holding member through the transparent portion of the processing tank and the transparent portion of the substrate holding member during the processing in the processing tank of the substrate held in the substrate holding member.

In the fourteenth embodiment, the substrate processing device of any one of the eighth to thirteenth embodiments is so configured that the imaging device images at least one of the surface of the substrate in the substrate holding member and the space sealed on the radially outside of the substrate in the substrate holding member, and the substrate processing device further comprises a controller for detecting any defect in the substrate and/or the substrate holding member, based on image data taken.

This embodiment make it possible to detect a defect in the substrate and/or the substrate holding device, using the controller calculating the image data taken.

In the fifteenth embodiment, the substrate processing device of the fourteenth embodiment is so configured that the controller learns criteria for determining the presence/absence and/or extent of a defect in the substrate and/or the substrate holder, based on a plurality of images of the substrate in normal state and/or in abnormal state, and determines the presence/absence and/or extent of any defect in the substrate and/or substrate holder from the image data, using the learned determination criteria.

This embodiment, involving learning defect determination criteria through machine learning with a deep neural network or the like, will improve determination accuracy and detection accuracy.

In the sixteenth embodiment, the substrate processing device of the fourteenth embodiment is connected via wire or wirelessly to a server that learns determination criteria for determining the presence/absence and/or extent of a defect in the substrate and/or the substrate holder, based on image data collected from a plurality of substrate processing devices, so that the controller determines the present/absence and/or extent of a defect in the substrate and/or the substrate holder from the image data taken, based on the determination criteria learned by the server.

For determining whether the substrate and/or the substrate holding member is defective, this embodiment permits combination of determination criteria based on image data taken in the substrate processing device and determination criteria based on image data taken in another substrate processing device or determination criteria based on image date taken in still another substrate processing device and thus improves determination accuracy and detection accuracy.

In the seventeenth embodiment, the substrate processing device of any one of the fourteenth to sixteenth embodiments detects a defect in the substrate and/or substrate holding member that includes at least a crack in the substrate and a leak of processing solution into the substrate holding member.

In the eighteenth embodiment, the substrate holding device of the fourteenth embodiment is configured so that the controller evaluates a decrease in transparency of the transparent portion, based on the image data.

This embodiment will prevent the degradation of images taken and perform detection processing with improved reliability.

The nineteenth embodiment provides a method for controlling a substrate processing device, comprising: holding a substrate in a substrate holding member including at least partly a transparent portion or being at least in part made of a transparent portion; imaging the interior of the substrate holding member through the transparent portion of the substrate holding member; and detecting any defect in the substrate and/or the substrate holding member, based on the image data taken.

This embodiment brings about similar effect as the first embodiment. This embodiment is applicable to substrate holding members for substrates of circular, polygonal, and other shapes.

The twentieth embodiment provides a storage medium storing a program for a computer to execute a method for controlling a substrate processing device, the computer executing: holding a substrate on a substrate holding member including at least partly a transparent portion or being at least in part made of a transparent portion; imaging the interior of the substrate holding member through the transparent portion of the substrate holding member; and detecting any defect in the substrate and/or the substrate holder, based on image data taken.

This embodiment brings about similar effect as the first embodiment. This embodiment is applicable to substrate holding members for substrates of circular, polygonal, and other shapes.

The embodiments of the present invention described above are intended to facilitate understanding of the present invention and not to limit the present invention. Various modifications and improvements are possible without departing the spirit of the present invention, and the scope of the present invention encompasses its equivalents. Provided that the above-described problem can be solved at least to some extent or that the effect can be achieved at least in part, it is possible to combine the constituent elements recited in the claims and the specification in any way or to omit some of them.

The present application claims priority to Japanese Patent Applications No. 2018-023302 filed on Feb. 13, 2018. The entire disclosure of Japanese Patent Applications No. 2018-023302 filed on Feb. 13, 2018, including specification, claims, drawings and summary is incorporated herein by reference in its entirety.

The entire disclosure of Japanese Patent No. 4124327 (Patent Literature 1), including specification, claims, drawings and summary is incorporated herein by reference in its entirety.

REFERENCE NUMERALS 11. substrate holder
12. first holding member
13. second holding member 13a. opening
14. hinge
15. hanger
17. base
30. imaging device
60. sealing member
60a. lip
60b. lip
60c. transparent part
61a. inner seal
61b. outer seal
80. base
81. ridge
82. support surface
83. recess
88. electrical conductor
90. support
90a. proximal portion
90b. distal portion
90c. transparent part
90d. outer circumferential part
92. electrical contact
92a. leg
92b. contact end
100. substrate processing device
101A. loading/unloading section
101B. processing section
102. cassette table
103. substrate transport device
103a. transporting robot
104. aligner
105. substrate loading/unloading subsection
105a. substrate loading/unloading device
105b. fixing table
105c. fixing head
106. spin dryer
107. stocker
108. pre-wet tank
109. pre-soak tank
110. pre-rinse tank
111. blow tank
110b. rinse tank
112. plating subsection
112a. plating tank
113. substrate-holder transport device
114. first transporter
115. second transporter
116. rail
120. device computer
120A. CPU
120B. memory
121. device controller
122. image diagnosis terminal
12a. transparent portion
130. imaging device
131. holder
132. vertically moving mechanism
133. front/back moving mechanism
134. transversely moving mechanism
135. moving mechanism
136. support column
137. base
141. support column
142. arm
143. gripper
144. base

What is claimed is:

1. A substrate holding member comprising:
a first holding member;
a second holding member that cooperates with the first holding member to hold a substrate therebetween, and the second holding member comprises an opening that exposes a first surface of the substrate; and
a transparent portion provided in at least one of the first and second holding members,
wherein the transparent portion is provided at least at a position in the first holding member, the position corresponding to a second surface of the substrate opposite to the first surface.

2. A substrate holding member according to claim 1, wherein the transparent portion permits observation therethrough of interior of the first holding member and/or the second holding member.

3. A substrate holding member according to claim 1, wherein the second holding member comprises a first seal for sealing between the substrate and the second holding member and a second seal for sealing between the first and second holding members, and the transparent portion is provided in the first holding member and/or the second holding member to permit observation of space sealed by the first and second sealing members.

4. A substrate holding member according to claim 3, wherein the transparent portion is at a position corresponding to bottommost of the sealed space when the substrate holding member is supported upright.

5. A substrate holding member according to claim 3, wherein the transparent portion is provided at a location in the first and/or second holding member corresponding to an electrical contact for supplying current to the substrate.

6. A substrate processing device comprising the substrate holding member of any one of claim 1.

7. A substrate processing device comprising:
a substrate holding member for holding a substrate, the substrate holding member including at least in part a transparent portion, the substrate holding member comprising a first holding member; a second holding member that cooperates with the first holding member to hold a substrate therebetween, and the second holding member comprises an opening that exposes a first surface of the substrate; and the transparent portion is provided in at least one of the first and second holding members; and
an imaging device for imaging interior of the substrate holding member through the transparent portion of the substrate holding member,
wherein the transparent portion is provided at least at a position in the first holding member, the position corresponding to a second surface of the substrate opposite to the first surface.

8. A substrate processing device according to claim 7, further comprising a substrate loading/unloading section for mounting and dismounting the substrate to and from the substrate holding member, wherein the imaging device is provided at the substrate loading/unloading section.

9. A substrate processing device according to claim 7, further comprising a transport device for transporting the substrate holding member, wherein the imaging device is disposed to image interior of the substrate holding member held on the transport device.

10. A substrate processing device according to claim 9, wherein the imaging device is mounted on the transport device.

11. A substrate processing device according to claim 9, wherein the imaging device is mounted on a moving mechanism independent of the transport device.

12. A substrate processing device according to claim 7, further comprising a processing tank for processing the substrate,
the processing tank being made at least partly of a transparent material, wherein
the imaging device images interior of the substrate holding member through the transparent material portion of the processing tank and the transparent portion of the substrate holding member when the substrate holding member is placed in the processing tank.

13. A substrate processing device according to claim 7, wherein the imaging device images at least one of a surface of the substrate in the substrate holding member and a space sealed on a radially outside of the substrate in the substrate holding member, and
the substrate processing device further comprises a controller for detecting any defect in the substrate and/or the substrate holding member, based on image data taken.

14. A substrate processing device according to claim 13, wherein the controller learns criteria for determining presence/absence and/or extent of a defect in the substrate and/or the substrate holder, based on a plurality of images of the substrate in normal state and/or in abnormal state, and determines presence/absence and/or extent of any defect in the substrate and/or substrate holder from the image data, using the learned determination criteria.

15. A substrate processing device according to claim 13, wherein the substrate processing device is connected via wire or wirelessly to a server that learns determination criteria for determining presence/absence and/or extent of a defect in the substrate and/or substrate holder, based on image data collected from a plurality of substrate processing devices, wherein
the controller determines presence/absence and/or extent of a defect in the substrate and/or the substrate holder from the image data taken, based on the determination criteria learned by the server.

16. A substrate processing device according to claim 13, wherein a defect in the substrate and/or the substrate holding member includes at least a crack in the substrate and a leak of processing solution into the substrate holding member.

17. A substrate holding device according to claim 13, wherein the controller evaluates a decrease in transparency of the transparent portion, based on the image data.

18. A method for controlling a substrate processing device, comprising:
holding a substrate in a substrate holding member including at least partly a transparent portion, the substrate holding member comprising a first holding member; a second holding member that cooperates with the first holding member to hold a substrate therebetween, and the second holding member comprises an opening that exposes a first surface of the substrate; and the transparent portion is provided in at least one of the first and second holding members, wherein the transparent portion is provided at least at a position in the first holding member, the position corresponding to a second surface of the substrate opposite to the first surface;
imaging interior of the substrate holding member through the transparent portion of the substrate holding member; and
detecting any defect in the substrate and/or substrate holder, based on image data taken.

19. A storage medium storing a program for a computer to execute a method for controlling a substrate processing device, the computer executing:
holding a substrate in a substrate holding member including at least partly a transparent portion, the substrate holding member comprising a first holding member; a second holding member that cooperates with the first holding member to hold a substrate therebetween, and the second holding member comprises an opening that exposes a first surface of the substrate; and the transparent portion is provided in at least one of the first and second holding members, wherein the transparent portion is provided at least at a position in the first holding member, the position corresponding to a second surface of the substrate opposite to the first surface;
imaging interior of the substrate holding member through the transparent portion of the substrate holding member; and
detecting any defect in the substrate and/or substrate holder, based on image data taken.

20. A substrate holding member that holds a substrate in a plating device comprising:
a first holding member;
a second holding member that engages with the first holding member to hold a substrate therebetween; and
a transparent portion provided in at least one of the first and second holding members.

21. A substrate holding member according claim 20, wherein the second holding member comprises a first seal which seals between the substrate and the second holding member, and a second seal which seals between the first and second holding members, and the transparent portion is provided in the first holding member and/or the second holding member to permit observation of space sealed by the first and second sealing members.

22. A substrate holding member according to claim 20, wherein:
at least one of the first and second holding members is movable between an open and a closed position, and at least one seal is provided so that in the closed position a sealed space is defined between the first and second holding members, and the substrate is held within the sealed space between the first and second holding members in the closed position, and
the transparent portion is provided in the first holding member and/or the second holding member such that the sealed space is observable through the transparent portion.

* * * * *